United States Patent
Khusnatdinov et al.

(10) Patent No.: US 10,580,659 B2
(45) Date of Patent: Mar. 3, 2020

(54) PLANARIZATION PROCESS AND APPARATUS

(71) Applicant: CANON KABUSHIKI KAISHA, Tokyo (JP)

(72) Inventors: Niyaz Khusnatdinov, Round Rock, TX (US); Douglas J. Resnick, Leander, TX (US); Dwayne L. LaBrake, Cedar Park, TX (US)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 16/049,003

(22) Filed: Jul. 30, 2018

(65) Prior Publication Data
US 2019/0080922 A1 Mar. 14, 2019

Related U.S. Application Data

(60) Provisional application No. 62/558,577, filed on Sep. 14, 2017.

(51) Int. Cl.
| | |
|---|---|
| *H01L 21/3105* | (2006.01) |
| *H01L 21/02* | (2006.01) |
| *G03F 7/00* | (2006.01) |
| *H01L 21/66* | (2006.01) |

(52) U.S. Cl.
CPC .. *H01L 21/31051* (2013.01); *H01L 21/02288* (2013.01); *H01L 21/02345* (2013.01); *H01L 21/31058* (2013.01); *G03F 7/0002* (2013.01); *H01L 22/12* (2013.01); *H01L 22/20* (2013.01)

(58) Field of Classification Search
CPC .............................................. H01L 21/31051
See application file for complete search history.

(56) References Cited

U.S. PATENT DOCUMENTS

| | | | |
|---|---|---|---|
| 5,736,424 A | 4/1998 | Prybyla et al. | |
| 6,936,194 B2 | 8/2005 | Watts | |
| 7,105,452 B2 | 9/2006 | Sreenivasan | |
| 7,157,036 B2 | 1/2007 | Choi et al. | |
| 7,186,656 B2 | 3/2007 | Sreenivasan | |

(Continued)

FOREIGN PATENT DOCUMENTS

| | | |
|---|---|---|
| JP | 2013-211450 A | 10/2013 |
| JP | 2015-178221 A | 10/2015 |

OTHER PUBLICATIONS

Dwayne L. Labrake, Niyaz Khusnatdinov, US.S. Appl. No. 15/896,756, Superstrate and a Method of Using the Same, filed Feb. 14, 2018.

*Primary Examiner* — Dale E Page
*Assistant Examiner* — Christopher A Johnson
(74) *Attorney, Agent, or Firm* — Daniel Ratoff

(57) ABSTRACT

Methods and apparatus for planarization of a substrate. Material is dispensed onto the substrate that varies depending upon the substrate topography variation. A superstrate is brought into contact with the material, the material takes on a shape of the superstrate. The material is solidified. The superstrate is lifted away from the solidified material. Material has a first shrinkage coefficient. Second material is dispensed onto the solidified material with an average thickness. The average thickness is greater than a second material thickness threshold that is dependent upon step height of the substrate and the first shrinkage coefficient. The second material is then solidified.

14 Claims, 16 Drawing Sheets

(56) References Cited

U.S. PATENT DOCUMENTS

| | | | |
|---|---|---|---|
| 7,241,395 B2 | 7/2007 | Sreenivasan et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,394,282 B2 | 3/2013 | Panga et al. | |
| 2010/0012622 A1* | 1/2010 | Panga | B82Y 10/00 216/52 |
| 2015/0048050 A1* | 2/2015 | Sreenivasan | B05D 1/40 216/37 |
| 2016/0351409 A1 | 12/2016 | Takahata et al. | |

* cited by examiner

PLANARIZATION PROCESS AND APPARATUS

REFERENCE TO RELATED APPLICATION

This patent application claims priority to U.S. Provisional Application Ser. No. 62/558,577 filed Sep. 14, 2017, which is incorporated by reference herein.

BACKGROUND

Field of Art

The present disclosure relates to planarization processes.

Description of the Related Art

It is often necessary to planarize a substrate. For example, the process for creating a semiconductor device includes repeatedly adding and removing material to a substrate producing a layered substrate with an irregular height variation (topography). As more layers are added to the substrate the height variation increases. This height variation has a negative impact on the ability to add additional layers to the layered substrate. One method of addressing this issue is to planarize a feature laden substrate. Lithographic patterning methods benefit from patterning a planar surface. In ArFi laser based lithography, planarization improves depth of focus (DOF), critical dimension (CD), and critical dimension uniformity. In extreme ultra violet lithography (EUV), planarization improves feature placement and DOF. In nanoimprint lithography (NIL) planarization improves feature filling and CD control after pattern transfer.

In the semiconductor industry the most common way to planarize is chemical and mechanical polishing (CMP). There are some disadvantages to CMP as it addresses mainly hard materials like metals and dielectrics. It can be difficult to apply CMP to a soft material like a resist and requires careful and tight process controls which can be difficult and expensive to implement and maintain. Another limitation with CMP is that topography with large open features larger than a few microns show dishing, i.e. the planarization is not ideal. The dishing cannot be prevented unless the features are laterally smaller. An alternative planarization technique is required.

One alternative planarization technique is contact planarization CP as described in U.S. Pat. No. 5,736,424 by Judith Ann PRYBYLA et al. (hereinafter Prybyla). Prybyla discloses a first step of coating a non-planar surface with a planarizing liquid. A flat object is then brought into contact with the planarizing liquid. After which the planarizing liquid is cured. The flat object is then removed. According to Prybyla under certain circumstances this process can result in a planarization film with a thickness between 500 nanometer (nm) and 10 micrometer ($\mu$m) and variation in the range of 50-200 nm. Prybyla discloses that under certain ideal circumstances if the shrinkage of the planarizing liquid is less than 10%, then the degree of planarization can be up to 96%. As the industry has progressed, the planarization requirements have also progressed, such that the process described by Prybyla is no longer sufficient.

Another alternative planarization technique is adaptive inkjet-based planarization that includes dispensing a variable drop pattern of polymerizable material between a first surface and a template. The drop pattern varies depending on the topography of the first surface. The template is then brought into contact with the polymerizable material. After which the polymerizable material is solidified. The solidified polymerizable material and the underlying substrate are then etched so that it has a second surface which may be planar. The drop pattern may be adjusted to compensate for parasitic effects such as pattern density variations and volume shrinkage of the solidified polymerizable material. It has been suggested that, the volume shrinkage may be compensated for by deforming the template or adjusting the drop pattern. Although, how much deformation is needed has not been previously disclosed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

Nanoimprint lithography technique disclosed in each of the aforementioned U.S. patents includes contacting an imprint template with a formable material. After the imprint template is brought into contact with the formable material, the formable material flows into indents within the imprint template so as to form a pattern. After the formable material has filled all of the indents within the imprint template, the formable material is cured. Other lithography techniques are optical lithography which may use ArFi, EUV optical sources.

SUMMARY

A first embodiment, may be a planarization method of a substrate. Wherein, a substrate surface of the substrate has a substrate topography variation. Wherein, the substrate topography variation may include a plurality of steps and a plurality of trenches. Wherein, a substrate step among the plurality of steps has a substrate step height. The substrate surface includes a substrate trench among the plurality of trenches that is adjacent to the substrate step. Wherein, the substrate trench has a trench width. The method may comprise a step of dispensing a first material onto the surface of the substrate. Wherein, a volume of the first material may vary across the substrate surface depending upon the substrate topography variation. The method may comprise a step of bringing a superstrate into contact with the first material such that the first material takes on a shape of the superstrate. The method may comprise a step of solidifying the first material. Wherein, a first material property of the first material is a first shrinkage coefficient. The method may comprise a step of lifting the superstrate away from the solidified first material. The method may comprise a step of dispensing a second material onto the solidified first material. The method may comprise a step of solidifying the second material.

In an aspect of the first embodiment, the substrate step marks a boundary between a first region and a second region. Wherein, a thickness of the second material may be dependent upon a variation in the shrinkage of the thickness of the first material across the surface of the substrate.

In an aspect of the first embodiment, the shrinkage in the thickness of the first material in the first region may be proportional to a top layer thickness of the first material in the first region. The shrinkage of the first material in the second region may be proportional to a thickness of the first material in the second region. The variation in the shrinkage of the first material may be equal to a difference between the shrinkage of the first material in the first region and the shrinkage of the first material in the second region.

In an aspect of the first embodiment, solidifying the first material may include exposing the first material to actinic radiation while the superstrate is in contact with the first material.

In an aspect of the first embodiment, the substrate step among the plurality of steps may be that step in which a ratio of the trench width divided by the substrate step height is highest among the plurality of steps.

In an aspect of the first embodiment, the second material may be dispensed onto the solidified first material with an average thickness. The average thickness may be greater than a second material thickness threshold that is dependent upon the substrate step height and the first shrinkage coefficient. The second material thickness threshold may be dependent upon the Poisson's ratio of the first material In an aspect of the first embodiment, the solidified first material may have a first material post-cure topography variation that is between 5-15 nm or 2-20 nm. The solidified second material may have a second material post-cure topography variation that is between 0-6 nm.

In an aspect of the first embodiment, the solidified first material may have a first material post-cure topography variation. The solidified second material may have a second material post-cure topography that is less than half of the first material post-cure topography variation.

In an aspect of the first embodiment, prior to solidifying the first material may has a pre-cure topography. Above the substrate trench the pre-cure topography may have an additional thickness $h_a$ that is substantially in accordance with equation (a). In which the substrate step height is $h_f$ and the first shrinkage coefficient is $k_s$.

$$h_a = h_f \frac{k_s}{1-k_s} \quad (a)$$

In an aspect of the first embodiment, one or both of the volume of the first material in the substrate trench and the shape of the superstrate are configured such that the additional thickness $h_a$ may be substantially in accordance with equation (a) in a first set of trenches among the plurality of trenches in which a ratio of the trench width with the substrate step height is greater than a first ratio. There may be no additional thickness $h_a$ in those trenches among the plurality of trenches not among the first set of trenches.

In an aspect of the first embodiment, the first ratio may be 2.

An aspect of the first embodiment, may further comprise baking the solidified first material prior to dispensing a second material onto the solidified first material.

An aspect of the first embodiment, may further comprise bringing the superstrate into contact with the second material such that the second material takes on the shape of the superstrate.

A second embodiment may be a planarization apparatus. Wherein, the planarization apparatus may be configured to planarize a substrate. Wherein, a substrate surface of the substrate may have a substrate topography variation. Wherein, the substrate topography variation may include a plurality of steps and a plurality of trenches. Wherein, a substrate step among the plurality of steps has a substrate step height. The substrate surface includes a substrate trench among the plurality of trenches that is adjacent to the substrate step. Wherein, the substrate trench has a trench width. The planarization apparatus may include a first dispenser for dispensing a first material onto the surface of the substrate. Wherein, a volume of the first material may vary across the substrate surface depending upon the substrate topography variation. The planarization apparatus may include a superstrate chuck configured to hold a superstrate. Wherein, the superstrate may be brought into contact with the first material such that the first material takes on a shape of the superstrate. The planarization apparatus may include a first means for solidifying the first material. Wherein, the superstrate may be configured to be lifted away from the solidified first material after the first material is solidified. The planarization apparatus may include a second dispenser for dispensing a second material onto the solidified first material. The planarization apparatus may include a second means for solidifying the second material.

In an aspect of the second embodiment, the first means for solidifying the first material may be one or more of: a source of actinic radiation that passes through the superstrate, applying pressure with the superstrate, and a heat source.

In an aspect of the second embodiment, the first dispenser may also be the second dispenser.

In an aspect of the second embodiment, the first dispenser may be an ink jet dispenser and the second dispenser may dispense the second material as a spun on coating or as droplets from the ink jet dispenser.

An aspect of the second embodiment, further comprising a heat source configured to bake the solidified first material prior to dispensing a second material onto the solidified first material.

In an aspect of the second embodiment, the second means for solidifying the second material is one or more of: a source of actinic radiation, applying pressure, and a heat source.

A third embodiment may be a method of manufacturing an article on a substrate. A substrate surface of the substrate has a substrate topography variation. Wherein, the substrate topography variation includes a plurality of steps and a plurality of trenches. Wherein, a substrate step among the plurality of steps has a substrate step height. The substrate surface includes a substrate trench among the plurality of trenches that is adjacent to the substrate step. Wherein, the substrate trench has a trench width. The method of manufacturing an article may include dispensing a first material onto the surface of the substrate. Wherein, a volume of the first material may vary across the substrate surface depending upon the substrate topography variation. The method of manufacturing an article may include bringing a superstrate into contact with the first material such that the first material takes on a shape of the superstrate. The method of manufacturing an article may include solidifying the first material. Wherein, a first material property of the first material is a first shrinkage coefficient. The method of manufacturing an article may include lifting the superstrate away from the solidified first material. The method of manufacturing an article may include dispensing a second material onto the solidified first material. The method of manufacturing an article may include solidifying the second material.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
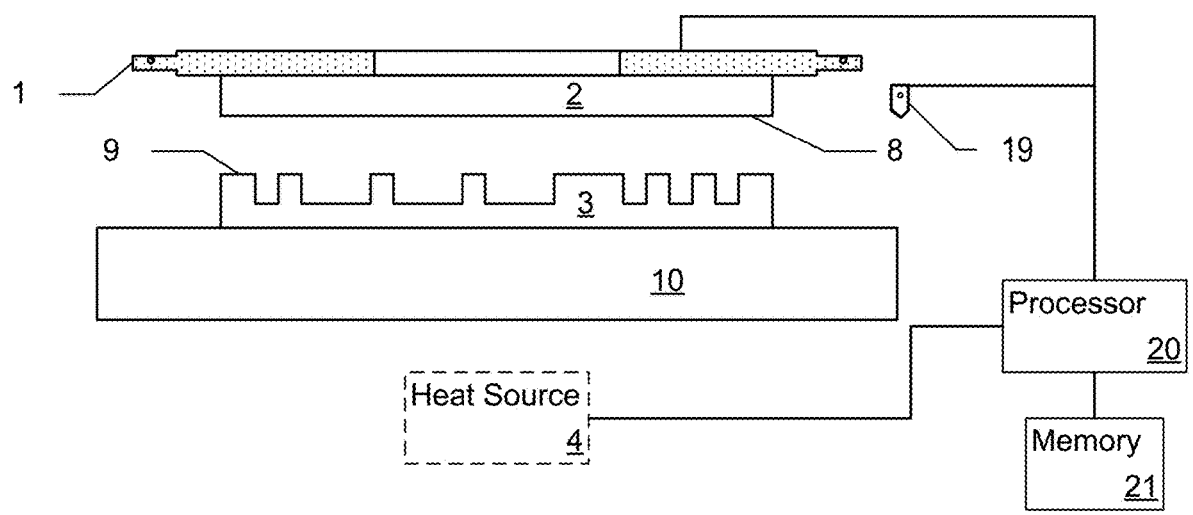
FIG. 1 is an illustration of a planarization system as might be used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed are systems and processes which will meet aggressive planarization targets. One method of meeting these aggressive planarization targets is to use a planarization method that includes depositing a planarizing formable material onto a wafer surface and cure the formable material using a whole wafer imprint tool. The applicant has determined that varying the drop pattern and deforming the template are not sufficient to compensate for the dual parasitic effect of both volume shrinkage and pattern density variation due to boundary condition effects at low pattern density regions. For aggressive planarization targets these compensation techniques are insufficient. The aggressive planarization targets may be within just individual die, within an imprint field or exposure field, or across the substrate.

Planarization System

FIG. 1 is schematic of an imprint type planarization tool. A superstrate chuck 1 may support a superstrate and is configured to position the superstrate relative to a substrate 3. The superstrate 2 is attached to the superstrate chuck 1. Various components may be used to position the superstrate 2 including but not limited, voice coils permanent magnets, spring, actuators, linear motors, pistons, etc. Alternative methods for moving the superstrate 2 relative to a stationary part may also be employed as long as the superstrate 2 is moved in a controlled manner to and from a top surface 9 of the substrate 3. The planarization tool may be controlled by a processor 20. The processor 20 may be a purpose built controller, a general purpose processor, an ASIC, DSP, FPGA, CPU, MPU, or any other device which is capable of receiving instructions, executing instructions, and sending instructions to the planarization tool. Instructions for controlling the imprint type planarization tool may be stored in a memory 21. The memory 21 may be a part of the processor 20 or separate from the processor 20. The memory 21 may be local or accessed via a network. The memory 21 may be a CD, DVD, hard drive, SSD, ROM, RAM, or any device which is capable of storing instructions which can be read by the processor 20. The instructions may be stored non-transitory computer readable memory 20 and executed by the processor 20.

The superstrate 2 may be used to planarize a substrate 3 (e.g. wafer) which is attached to a substrate chuck 10. The substrate 3 has a top surface 9 that contains a predefined pattern. The predefined pattern may be the result of one or more feature forming steps. For instance, a wafer may have an etched-in pattern, a pattern made with an imprint tool, an optical lithography tool, or a combination of these. The substrate 3 may also have some topography that is not related to the pattern itself but was produced during wafer manufacturing (e.g. previous layers lithography, film coatings, etc.). The net sum of all pattern based topography and all non-pattern based topography is the substrate topography. In an alternative embodiment, the planarization tool may also include a heat source 4 that is used in a baking step of the planarization process. In an alternative embodiment, the heat source 4 is separate apparatus such as an oven that is used in a baking step. The heat source 4 may include one or more of: a radiant heat source; an electromagnetic heat source; electric resistive heat source; a plasma heat source; a gas heat source; an open flame; an exothermic chemical reaction; etc.

Planarization Process

The superstrate 2 has a working surface 8. The working surface 8 of the superstrate 2 is the surface that contacts formable material droplets 11. The working surface 8 may be patterned, or may be non-patterned. For example, a featureless flat superstrate may be used for planarization. The working surface 8 may also be distorted by applying non-uniform pressure to the superstrate. The net effect of this patterning and non-uniform pressure is the superstrate topography. The superstrate topography may be substantially planar, (e.g. smooth with an average surface roughness less than 2 nm). A simpler embodiment may include a non-patterned superstrate which is not distorted by non-uniform pressure.

Figure 2:
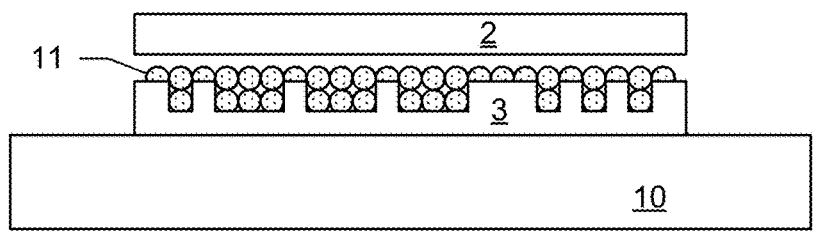
FIG. 2 is an illustration of a part of the planarization process as used in an embodiment.
Figure 3:
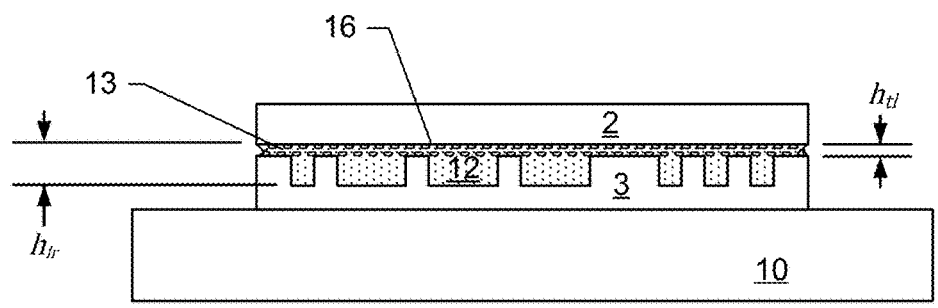
FIG. 3 is an illustration of a part of the planarization process as used in an embodiment.
Figure 4:
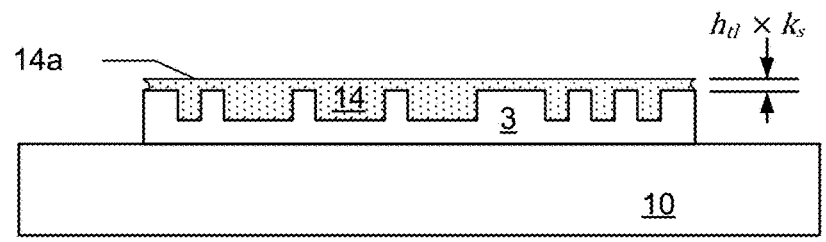
FIG. 4 is an illustration of a part of the planarization process as used in an embodiment.

The planarizing imprint process includes several stages which are shown schematically in FIGS. 2-4. As illustrated in FIG. 2 a first step in the planarization process includes dispensing the formable material droplets 11 onto the top surface 9 of the substrate 3. The density of the formable material droplets 11 may vary depending on the substrate topography. The top surface 9 has some substrate topography. The substrate topography may be known based on previous processing operations or may be measured using a profilometer, AFM, SEM or an optical surface profiler based on optical interference effect like Zygo NewView 8200. FIG. 2 also illustrates a pre-contact step in which the superstrate 2 is not yet in contact with the formable material droplets 11.

FIG. 3 illustrates a post-contact step after the superstrate 2 has been brought into contact with the formable material droplets 11 but before the polymerization process starts. Once the superstrate 2 is in contact with the formable material droplets 11, the droplets merge to form a formable material film 12 in the space between the superstrate 2 and the substrate 3, as the space between begins to fill with the formable material film 12. Ideally, the filling process happens in a uniform manner without any air or gas bubbles being trapped between the superstrate 2 and the substrate 3. A top layer 13 with an average thickness of $h_{tl}$ can form above the features of the top surface 9 as illustrated by the region surrounded by the dashed lines in FIG. 3. Under most circumstances it is not possible or desirable to get rid of the top layer 13 and achieve zero top layer thickness ($h_{tl}$=0). The formable material film 12 has a pre-cure topography 16 that is intended to match the superstrate topography.

The polymerization process or curing of the formable material may be initiated with actinic radiation (e.g. UV), but can also be initiated by using heat, pressure, chemical reaction, other types of radiation, or a combination of these.

FIG. 4 is an illustration of the cured formable material 14 after separation from the superstrate 2. On the scale of a whole wafer 3 the top surface of the cured formable material 14 may appear to have a flat and even surface. Nonetheless, there is a level of unevenness to the post-cure topography 14a which does not meet the current demands of the semiconductor and other industries, unless special steps are taken.

Figure 5:
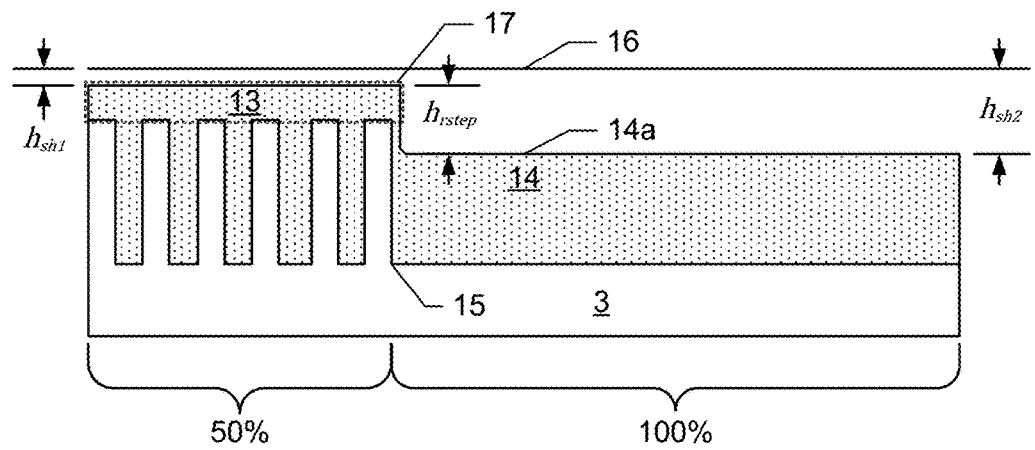
FIG. 5 is an illustration of an intermediate result of the planarization process illustrating shrinkage.

FIG. 5 is an illustration of an enlarged view of a portion of a planarized substrate in a region around a substrate step 15. The post-cure topography 14a includes a post-cure topography step 17 that is formed due to shrinkage being different in different areas of the substrate topography (an area before the substrate step 15 and after the substrate step 15). The post-cure topography step 17 has a post-cure topography step height ($h_{rstep}$) Substrate step 15 may form the boundary for a transition zone from a large full height feature into a region with large zero height feature or low height feature. In an embodiment a fully etched-in feature may be considered to have zero relative height.

The substrate step 15 may also be formed in a transition region between patterns of different fill factors, for instance, from a pattern of small dense features into a large open area with zero height (or low height) as illustrated in FIG. 5. In an exemplary embodiment, the substrate topography may include a full height large feature that has zero fill factor or near zero fill factor (no formable material is required to fill in any etched profile). The substrate topography may also have a region with a zero height feature that has 100% fill factor (all of the feature needs to be filled in with formable material) as shown in FIG. 5. The substrate topography may also have a region with alternating lines and spaces with some duty cycle. As an example, alternating line and spaces may have a 50% fill factor as illustrated in FIG. 5.

The volume of the formable material droplets 11 varies over the area of the substrate 3 and may be calculated based on the fill factor of the substrate topography. This variation in volume may be achieved by dispensing the formable material droplets 11 with an ink jet dispenser 19. After the formable material droplets are dispensed, the droplets spread and the imprint superstrate 2 helps to form a substantially flat formable material film 12. After polymerization of the formable material film 12 and separation of the superstrate 2, it becomes apparent that shrinkage of the formable material 12 has occurred and this gives rise to shrinkage step 17 as illustrated in FIG. 5.

A center region of the large open area is unaffected by the boundaries and can therefore be treated as typical formable material film without boundaries. In which case, the formable material film shrinkage $h_{sh2}$ is proportional to the original liquid formable material film thickness $h_{lr}$ (FIG. 3) and a shrinkage coefficient $k_s$ as described by equation (1) below. The shrinkage coefficient $k_s$ is a property of the formable material and is typically below 15%.

$$h_{sh2}=h_{lr} \times k_s \quad (1)$$

In the areas of the substrate topography where the pattern duty cycle is low or zero the top layer shrinkage $h_{sh1}$ is mostly proportional to $h_{tl}$ (top layer thickness). Areas of substrate topography that are featureless and of full height will also have only the top layer and will have the same top layer shrinkage $h_{sh1}$ as low duty cycle region.

$$h_{sh1}=h_{tl} \times k_s \quad (2)$$

The height of the formed step $h_{rstep}$ in the cured formable material can be estimated using equation (3) below:

$$h_{rstep}=h_{sh2}-h_{sh1} \quad (3)$$

Figure 6:
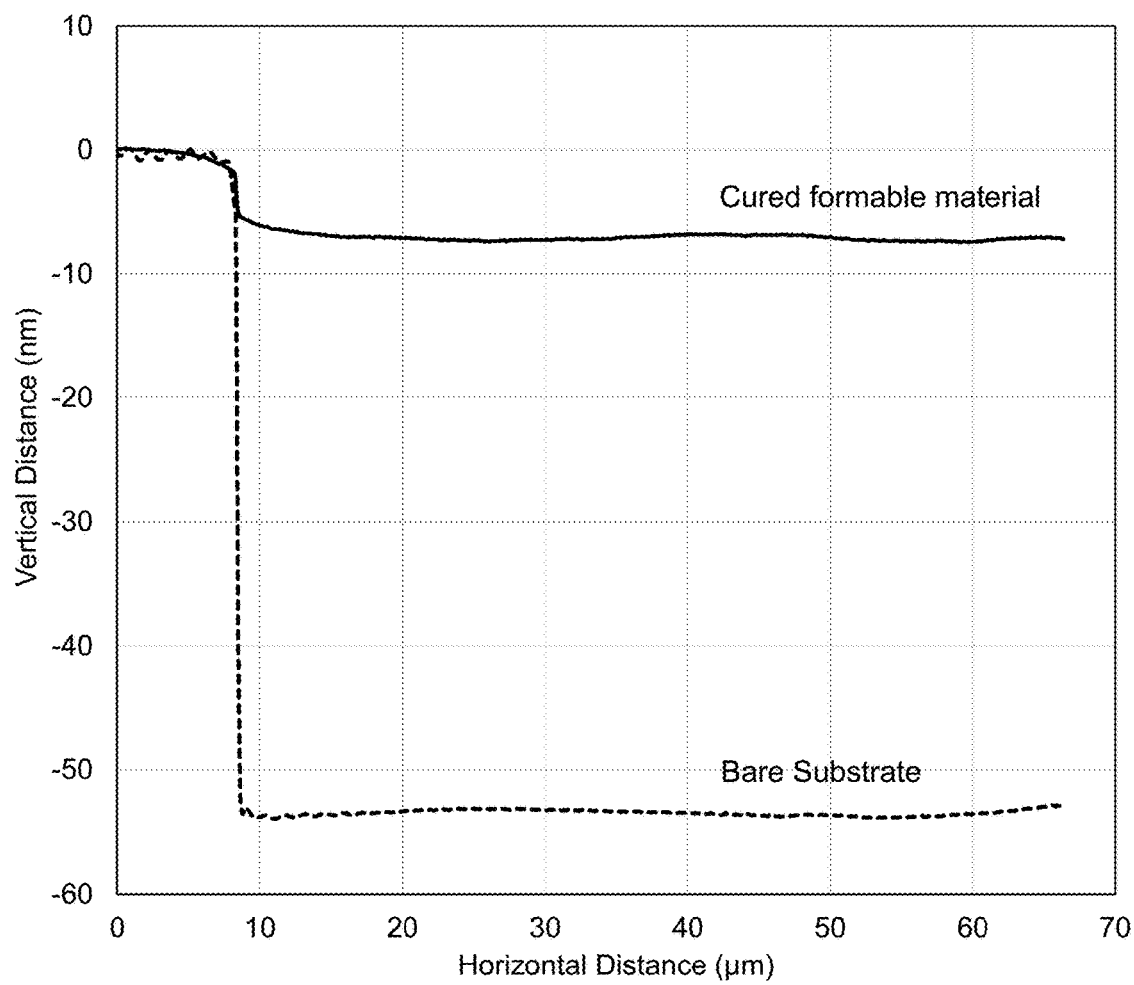
FIG. 6 is an illustration of topography profile, before and during an intermediary step.

FIG. 6 is an illustration of profiles of a substrate step 15, and a post-cure topography step 17 that is a part of the post-cure topography 14a that has formed on formable material surface after formable material polymerization and superstrate separation. These profiles were obtained with an AFM probe. The original substrate step height was measured to be 54 nm and the formable material step height was measured to be 6.5 nm.

Imprint planarization and the subsequent formable material shrinkage leads to post-cure topography steps 17 all around features across the whole substrate. These steps occur in transition zones from large open areas to large full height features, or to areas with low duty cycle patterns.

Figure 7A:
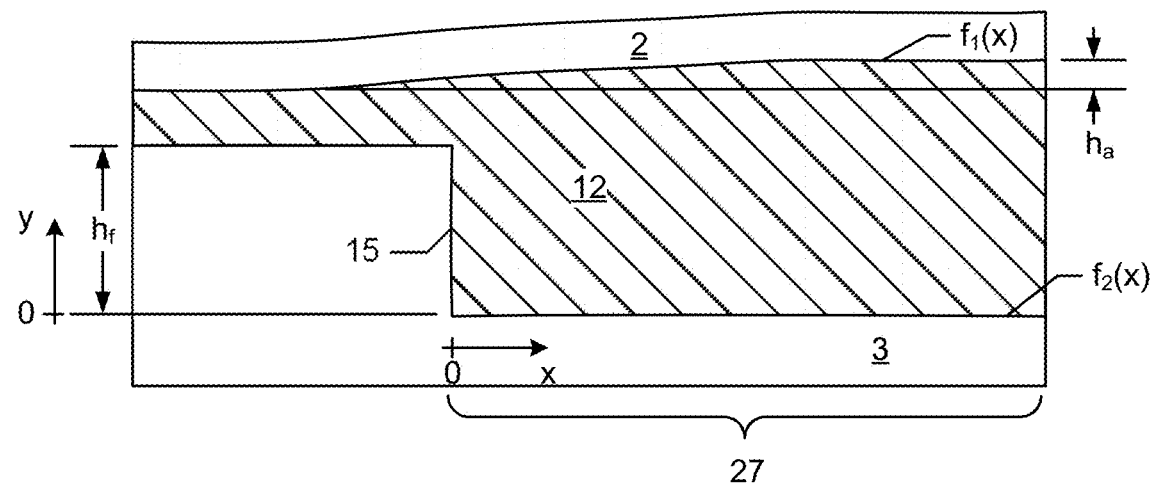
FIG. 7A-D are illustrations of multiple steps in the planarization process.

One embodiment may include compensating for the formable material shrinkage by dispensing additional formable material while imprinting with a superstrate that is flexible enough to bend above the additional formable material in the necessary regions with large open areas in a controlled manner as illustrated in FIG. 7A.

FIG. 7A is an illustration of a substrate 3 that includes a substrate step 15 bordering a large open area 27. The substrate topography varies along both directions x and y. For purposes of this discussion local topography is described in terms of edges and profiles of edges. These profiles of edges may be described in two dimensions: relative height; and a dimension (x) which is perpendicular to an edge. In which case a local description of the substrate topography around a substrate step 15 can be represented by a step profile denoted as $f_2(x)$ where a zero reference point is located at the edge of the large open area 27 as illustrated in FIG. 7A. FIG. 7A also illustrates a formable material film 12 between the substrate 3 and a flexible superstrate 2. The superstrate 2 has a working surface 8 represented by a profile $f_1(x)$ with the same zero reference point as $f_2(x)$.

In an embodiment the superstrate 2 is configured to have a non-flat superstrate profile $f_1(x)$ such that there is more formable material above a region which is predicted to shrink more, such as the large open area 27. In addition to having a non-flat superstrate profile $f_1(x)$, more formable material is dispensed in the large open area 27 such that the region above the large open area 27 has a formable material film 12 with an additional thickness $h_a$ in order to compensate for the shrinkage differential. The applicant has determined that this additional thickness $h_a$ goal is substantially (with an accuracy of less than 10 nm) a function of both the substrate step height $h_f$ and the shrinkage coefficient $k_s$ of the formable material as described by equation (4) below. In the context of the present application substantially means within the mechanical ability of an embodiment to control the deformation accuracy of a superstrate (in the range below 10 nm) and/or control the droplet volume (sub-picoliter).

$$h_a = h_f \frac{k_s}{1-k_s} \quad (4)$$

Figure 7B:
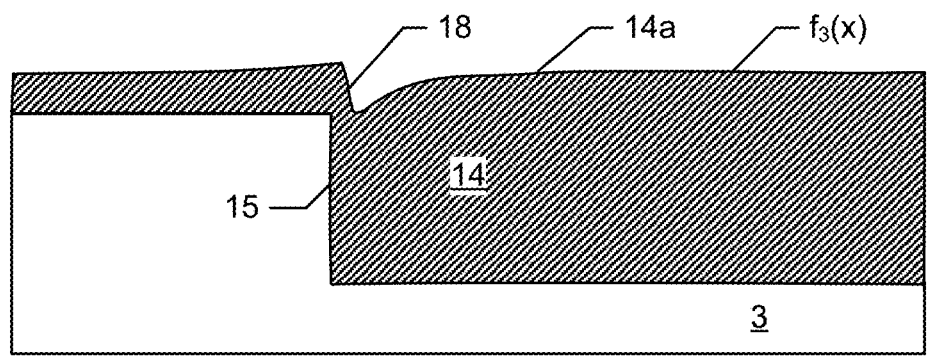

The applicant has determined that even when extra formable material is added and a flexible superstrate is used the resultant post-cure topography is not completely planar at edges near large open area 27. FIG. 7B is an illustration of the resulted post-cure topography.

Dip Forming Set of Criteria

The cured formable material 14 has a post cure topography 14a that is mostly flat except the area above the step 15 where a first dip 18 as illustrated in FIG. 7B is formed. The applicant has determined that this first dip has a tendency to form above substrate topography that meet one or more of dip forming set of criteria. One of the dip forming set of criteria is being next to large open area 27 as illustrate in FIG. 7B.

This dip forming criteria is a function of both topography and shrinkage. The typical shrinkage is on the order of 10%, and can likely range anywhere between 3% and 20% depending on the composition of the formable material. In an exemplary embodiment, the planarization of a substrate that includes 100 nm deep feature such as those illustrated in FIG. 5 exhibits shrinkage on the order of 8 nm. For example, if the liquid formable material thickness $h_{lr}$ is 120 nm, the top layer thickness $h_{tl}$ is 20 nm, and the shrinkage coefficient $k_s$ is ~8%, then the film shrinkage $h_{sh2}$ is 9.6 nm and the top layer shrinkage $h_{sh1}$ is 1.6 nm and the difference between the two thicknesses and thus the height of the formed step $h_{rstep}$ is 8 nm.

Figure 8:
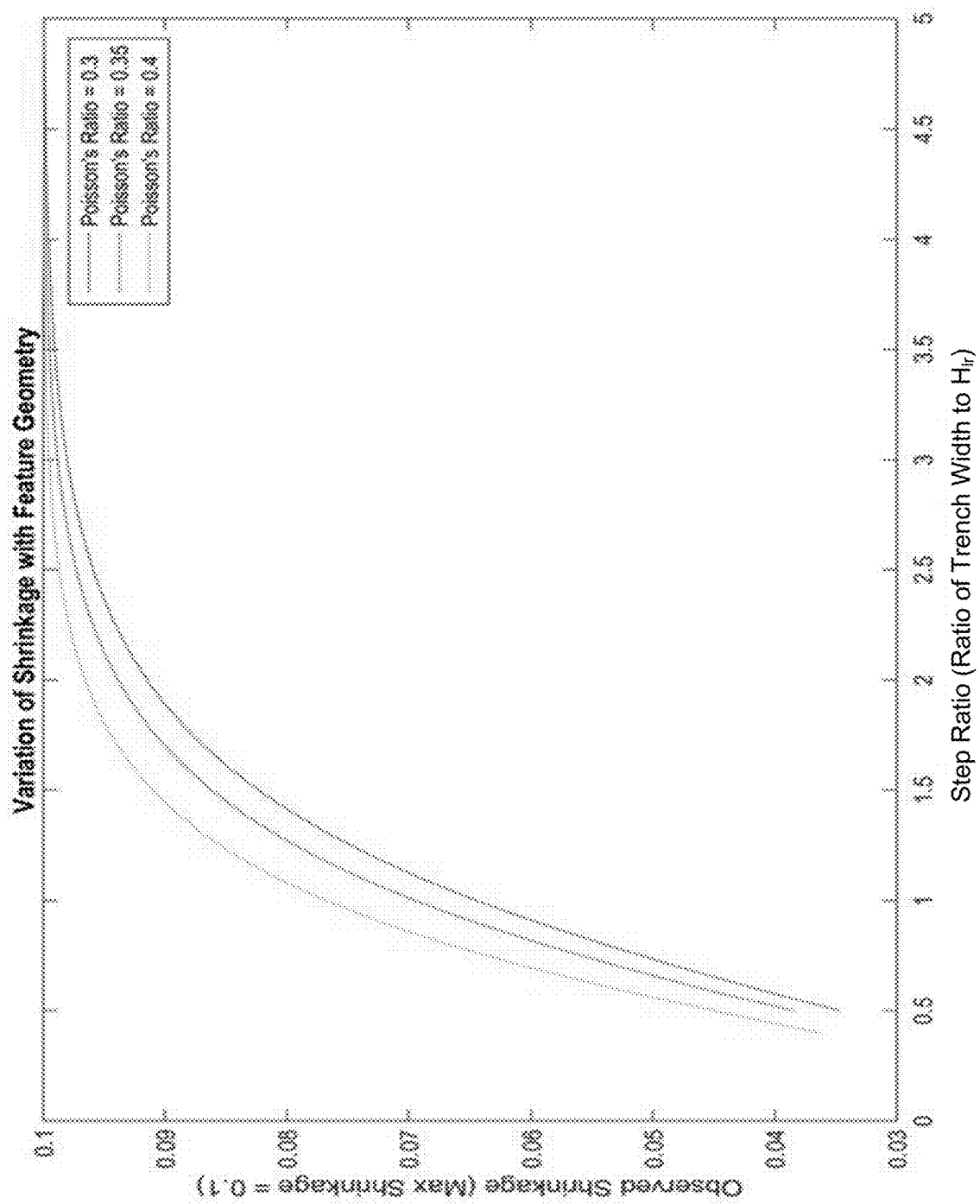
FIG. 8 is an illustration of the effect of shrinkage.

The applicant has observed this 8 nm shrinkage occurring in these relatively shallow features. In the context of the present disclosure an aspect ratio, AR, is defined as $$\left(\frac{h_f}{\text{trench width}}\right),$$

where $h_f$ is the feature height or trench depth. The trench width may be defined as the smallest distance between two parallel sidewalls. Any other shaped trench, including rectangles, polygons, ovals, etc., can be approximated by a set of linear trenches. The generic trench width is defined as the smallest cross-sectional distance between parallel sidewalls in all possible cross-sections. For instance, the trench width of a rectangular feature will be the shortest side length of the rectangle. As the AR of the features increases, the amount of shrinkage decreases. A substrate may include non-rectangular features in which case the features may be divided into sub-features which are rectangular. This decrease in shrinkage is a result of shear loading on the cured formable material at the sidewalls of the trenches. For shallow features (small aspect ratio) the shear load is reduced as you move away from the feature sidewall, meaning shrinkage can occur to its maximum value. FIG. 8 also illustrates how a step ratio of the trench width to the trench depth (in the context of the present disclosure this step ratio is defined as the inverse of the AR) has an effect on the observed shrinkage. When the trench width is three times the height of the trench almost full shrinkage was observed. When the trench width is half the height of the trench the shrinkage drops by approximately 35% of the maximum value. The applicant has also found that as the trench width approaches one fifth the height of the trench the shrinkage approaches zero. Poisson's ratio has also been shown to have an effect as illustrated in FIG. 8.

This information is useful when planarizing real devices which have a large variety of features with different feature sizes from 100 μm down to 10 nm. In a first example, the substrate 2 may include a primary small half pitch pattern in which the features have an aspect ratio on the order of 5:1 (step ratio≈0.2, AR≈5) with a trench height of 100 nm-200 nm and trench width of around 20 nm-40 nm. In the primary small half pitch pattern only the top layer shrinks. In a second example, the substrate 2 includes a trench that is a large open area 27 immediately next to the primary small half pitch pattern which is bounded by a step 15. The large trenches may have an aspect ratio that is greater 1:1 (step ratio≈1, AR≈1) or 1:2 (step ratio≈2 AR≈0.5) in which the trench height is on the order of 200 nm and width of the trench may be greater than 200 nm and up to 10 μm. In which case there will be approximately full shrinkage immediately adjacent to the small pitch pattern. A third example is an isolated trench on the substrate 3. Examples of isolated trenches include large logic type features, align marks, metrology marks, kerf areas, which can be up to 100 microns in width. These isolated trenches may be expected to have full material shrinkage, while the region around the isolated trench may have a lower shrinkage rate. A fourth example may be a die size trenches (or raised areas) which may be on the order of a few millimeters. Die size trenches much like the isolated trenches should be expected to have full material shrinkage.

The applicant has found that when the large open area (trench) adjacent to step 15 has an AR of 0.5 that a first dip 18 will form on the post-cure topography 14a even when the shrinkage is compensated for. The edge of the step 15 prevents planarity on the nm scale from being obtained even with increased volume of formable material is added to otherwise compensate for the shrinkage. In some cases a small bump may also form in the post-cure topography 14a next to the dip. In an embodiment, a substrate trench among a plurality of trenches may be considered to meet the dip forming criteria if the trench width is greater than a first threshold. The first threshold may be a function of the aspect ratio relative to an adjacent step and/or material properties of the dispensed formable material.

The applicant has found it helpful to understand the effect of the substrate step 15 on the post-cure topography 14a with an analytical model of the profile post-cure topography 14a. For example, generalized Heaviside step function θ(−x) may be used to describe the step profile $f_2$ as expressed by equation (5):

$$f_2(x) = h_f \theta(-x) \quad (5)$$

$$\theta(x) = \begin{cases} 1: & x \geq 0 \\ 0: & x < 0 \end{cases}$$

While the thickness of the liquid formable material film $h_{lr}$ may be described by equation (6) below.

$$h_{lr}(x) = f_1(x) - h_f \theta(-x) \quad (6)$$

The applicant has found that if $f_1(x)$ is to accurately represent the working surface 8 of the superstrate 2 it should be limited to smoothly varying functions with a continuous derivative, while adding the Heaviside function means that $h_{tr}$ is not a smoothly varying function. While the post-cure topography 14a may be expressed by function $f_3(x)$ as described by equation (7) which can also be described by simplified equation (8).

$$f_3(x)=(1-k_s)(f_1(x)-h_f\theta(-x))+f_2(x) \quad (7)$$

$$f_3(x)=(1-k_s)f_1(x)+k_s h_f\theta(-x) \quad (8)$$

The applicant has found that while it is possible to create a post-cure topography 14a that is mostly flat, there remain regions where some depressions and bumps are formed on the post-cure topography 14a. The applicant has found that these variations in height are described by the second term in the Equation 8 which is proportional to the step height $h_f$ and the shrinkage coefficient $k_s$.

The applicant has determined that an additional process step is necessary in order to improve the planarization efficiency (deviation from planarity) by getting rid of these variations (i.e. dips and bumps such as first dip 18) in the post-cure topography 14a or to make them within the specified height range.

Figure 7C:
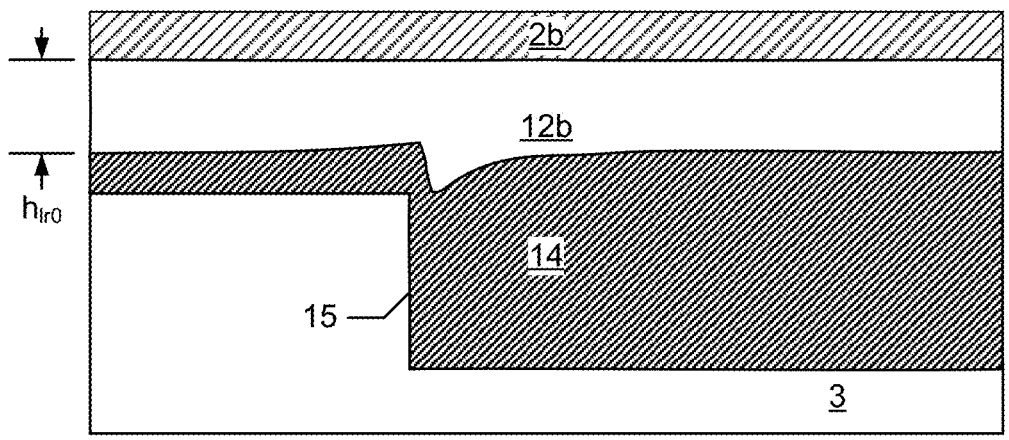

In an embodiment, the additional process step (additional stage) includes depositing a second film of liquid formable material 12b onto the post-cure topography 14a in a uniform manner as illustrated in FIG. 7C so that it has a thickness of $h_{tr0}$. After the second film 12b is deposited a flat featureless superstrate 2b may then be brought into contact with the second film 12b. In an alternative embodiment the flat featureless superstrate 2b is not brought into contact with the second film 12b and the second film 12b relaxes to a substantially planar state. In the additional process step in contrast to the intermediary process step (intermediary stage), the liquid formable material used to form the second film 2 is dispensed as uniform in thickness film independently of the underlying pattern of the substrate 3. The spread time of the liquid formable material may be long enough to allow for redistribution of the liquid formable material to fill in and planarize the depressions and bumps on the post-cure topography 14a. The additional process step may rely on the liquid formable material re-flowing so as to planarize imperfections in the post-cure topography 14a.

The spread time of the liquid formable material should be long enough so that it achieves over time a substantially stationary state (i.e. stops flowing). In a first exemplary embodiment the spread time is 6 seconds. In a second exemplary embodiment the spread time is 10 seconds. In a third exemplary embodiment the spread time is configured to be adjustable in the range of 6 to 10 seconds. The spread time may also be configured to be adjustable in the range of 1 to 15 seconds.

Figure 7D:
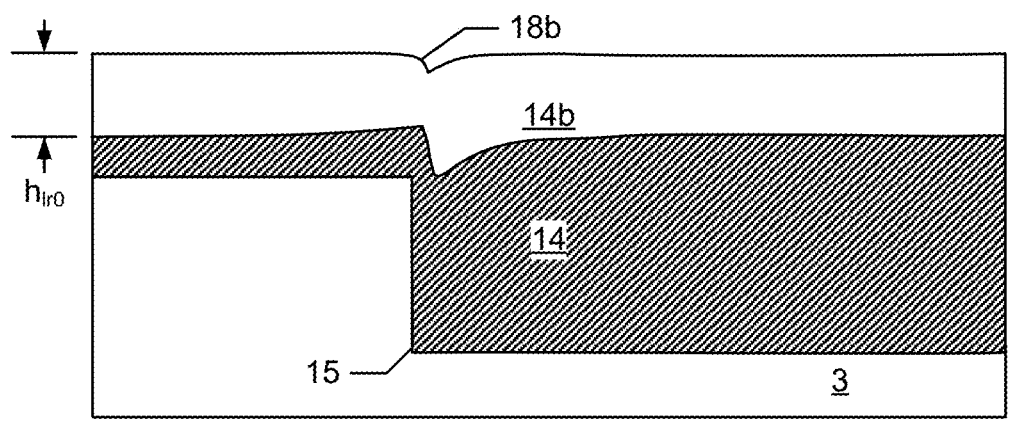

After the liquid formable material has spread so as to create a second film 12b with a planar surface, the second film 12b is cured so as to create a second cured formable material 14b as illustrated in FIG. 7D. In an embodiment, the second cured formable material 14b is mostly flat except for some feature boundary areas where a dip 18b and/or bumps can be observed. The applicant has observed that the additional process step can reduce the variation in the topography. In an embodiment, the dips 18b may be 3 nm or smaller.

Process

Figure 9A:
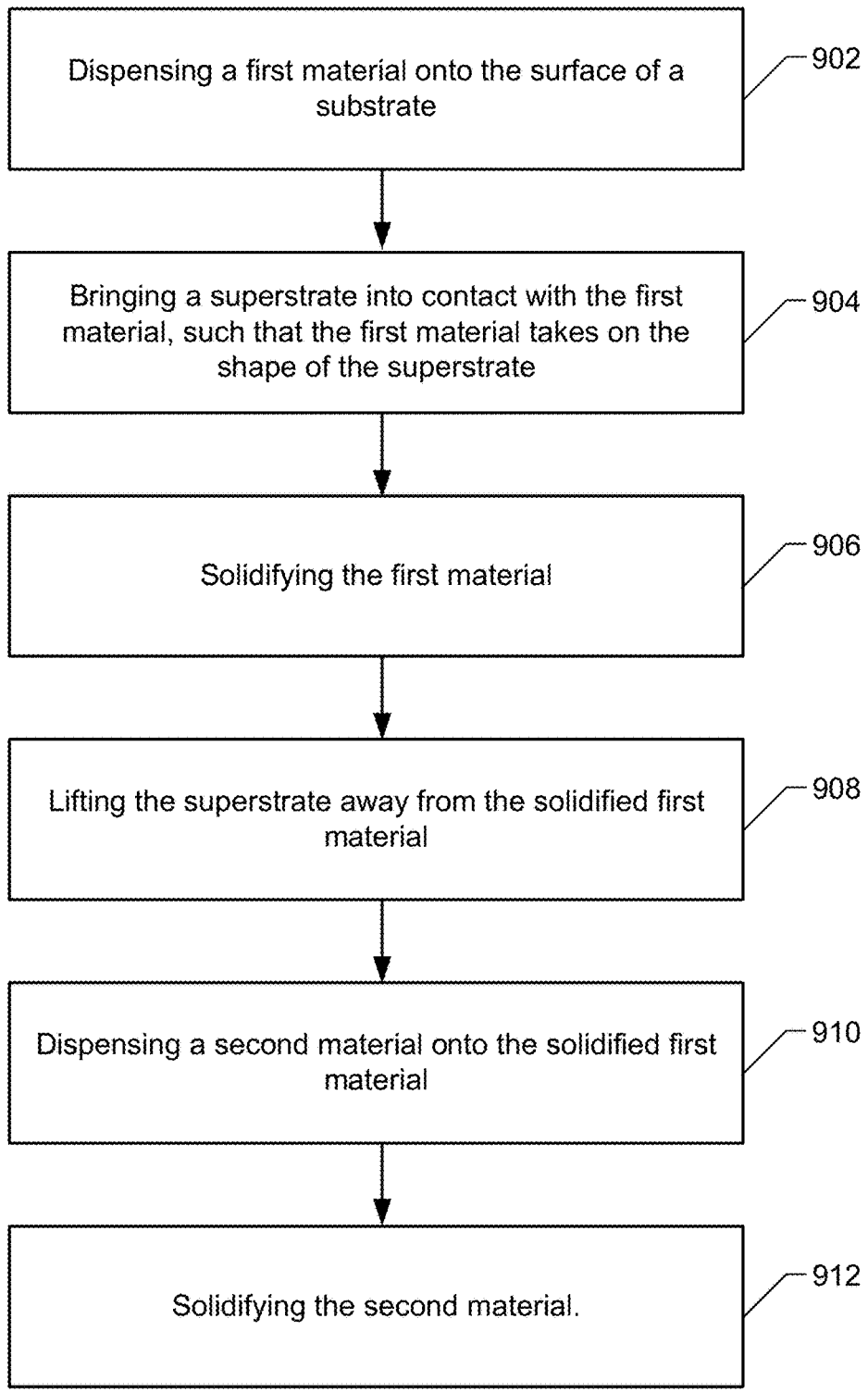
FIGS. 9A-B are illustrations of processes as used in an embodiment.

An embodiment may be a process 900 as illustrated in FIG. 9A which can also be described as two sequential formable material layer imprinting.

A first step 902 of the process 900 includes using pattern targeted dispensing such that the volume of the dispensed formable material matches the volume required for the pattern to be planarized. The formable material may be dispensed as droplets 11. The drop pattern may reflect the fill factor and the shrinkage coefficient $k_s$.

A second step 904 of the process 900 includes bringing the superstrate 2 into contact with the formable material droplets 11 causing the formable material film 12 to form. A third step 906 includes solidifying the formable material film 12 while the superstrate 2 is still in contact with the formable material film 12. The formable material film 12 may be solidified using one or more of: actinic radiation; pressure; chemical exposure; and heat. During a fourth step 908 the superstrate 2 is lifted away from the cured formable material 14. After curing, the planarization is not yet ideal. Grooves (e.g. first dip 18) form in the post-cure topography 14a because the shrinkage is non-uniform. The shrinkage pattern reflects the underlying pattern of the substrate 3 (it depends on the pattern itself, its etch depth, formable material properties and formable material distribution).

During a step 910, formable material is dispensed onto to the cured formable material 14 with a uniform pre-chosen thickness. This pre-chosen thickness is determined by first dip height 18. It should be thicker than the dip. The pre-chosen thickness is also determined by an ability of the liquid formable material to reflow. For example for 10 nm deep dips a 24 nm thick uniform film was chosen. In an embodiment, the pre-chosen thickness of the liquid formable material is at least 1.1 times the dip height. The upper limit for the pre-chosen thickness is limited by the subsequent processes that are performed after the process 900. As discussed above the depths of the grooves are a function of the shrinkage coefficient and the height of the steps in the pattern. But not all of the steps caused these grooves to form. Only steps which meet the dip forming criteria listed above will cause these artifacts in the post-cure topography 14a to form. Dispensing step 910 is different from dispensing step 902. During dispensing step 902 the volume of the formable material varies across the substrate 3 and is dependent upon the underlying pattern. While during the dispensing step 910 the volume of the formable material per unit of surface area does not vary across the substrate 3. The underlying pattern of the substrate 3 does influence the thickness of the second film 12b. There should be enough time for the formable material to be allowed redistribute itself to fill in the groves in the formable material created after the previous step. During a step 912 the second film 12b is cured. The second film 12b may be solidified with using one or more of: actinic radiation; pressure; chemical exposure; gas exposure; and heat. The second film 12b is cured to form the second cured formable material 14b which has a higher planarization efficiency then layer 14. In an alternative embodiment, the second film 12b is cured is brought into contact with superstrate and cured such that the second film 12b takes on the shape of the superstrate.

Alternative Process

Figure 9B:
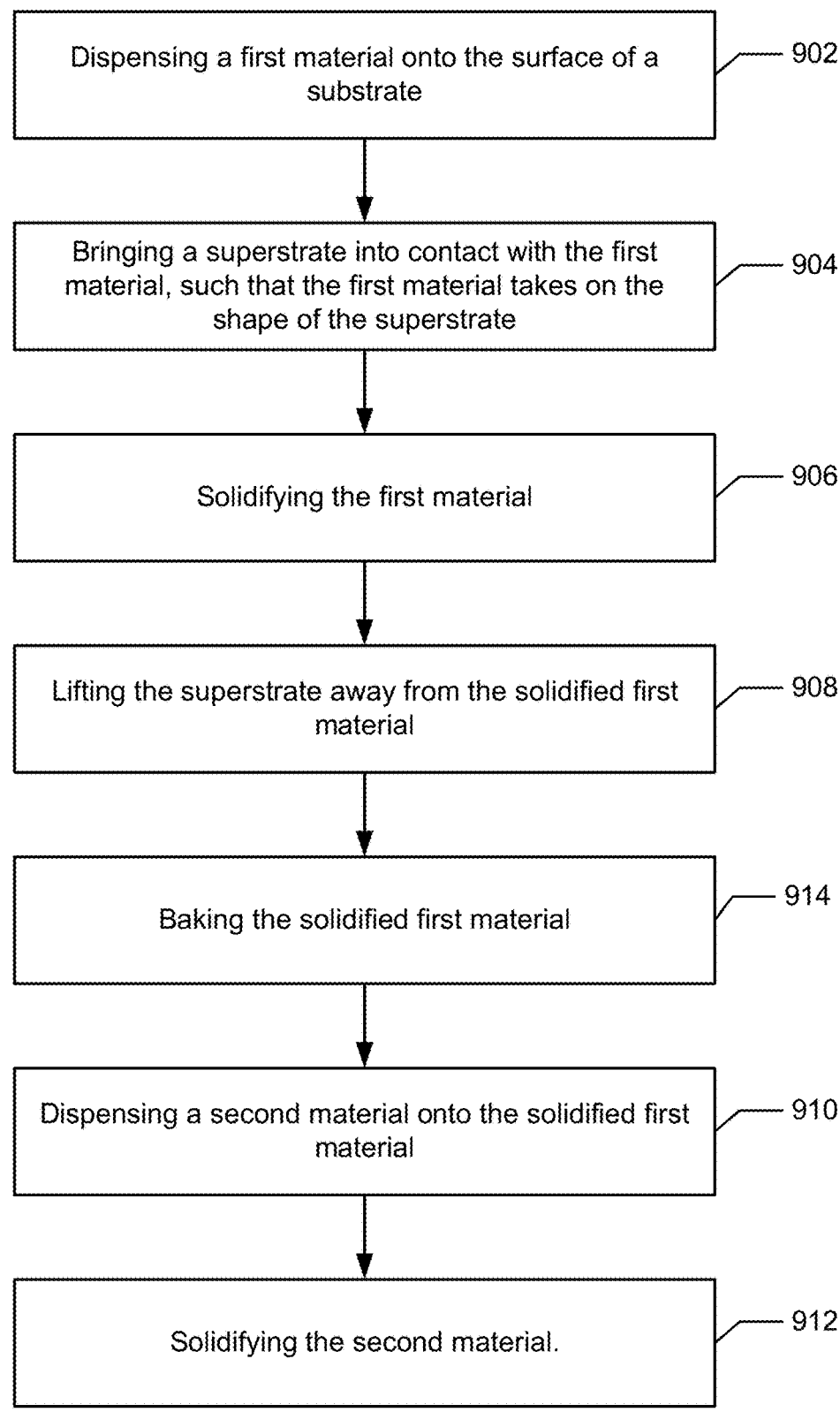

The process described above produces cured formable film 14b with a high planarization efficiency. The applicant, has found that subsequent processes can reduce the planarization efficiency of the cured formable film 14b produced in process 900 described above. For example, heating the cured formable film 14b can reduce the planarization efficiency. For instance, a subsequent process may include chemical vapor deposition (CVD) of a silicon dioxide (SiO2) hard mask or the spin on deposition of spin on glass hard mask. The cured formable films may then shrink in an uneven matter that affects the planarity of the new top surface. The applicant has found that this problem can be addressed in an alternative embodiment, illustrated in FIG. 9B. FIG. 9B is an illustration of a method 900b that is substantially similar to method 900 except that it includes a step 914 of baking the cured formable material 14 after step 908 and prior to step 910.

The applicant has found that method 900b can achieve a flat surface on top of a patterned substrate that is resistant to thermal shrinkage. Method 900b accomplishes this task by performing step 914 of baking the cured formable material 14 after each separation step except for the last top layer. In an alternative embodiment, the last top layer is also backed prior to subsequent processing. The process 900b may be performed in cycles consisting of planarizing and baking of steps 902-910. The baking temperature may be determined by the following subsequent process steps where heating occurs. In an embodiment, the baking temperature is equal to or higher than the maximum temperature achieved by the following subsequent processes. In an alternative embodiment, after the cured formable film 14b during the dispensing step 910 the volume of the formable material per unit of surface area does vary across the substrate to compensate for the additional shrinkage experienced after the heating step.

The top resist layer might not to be baked because the final baking step might be performed by customer inadvertently or purposely during customer specific process steps. The top layer resist can be baked in the described method if it is necessary.

Experimental Results

Figure 10A:
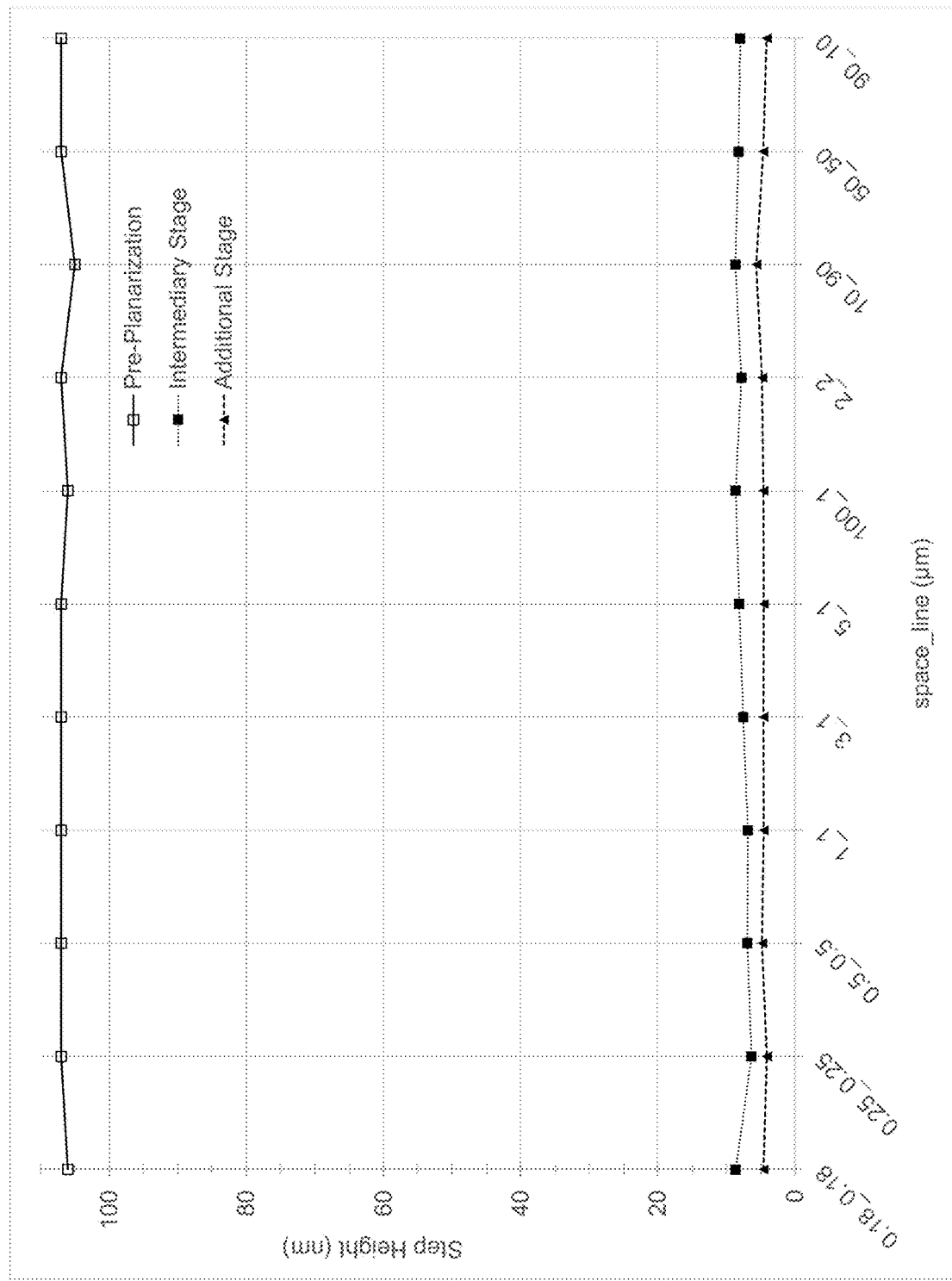
FIGS. 10A-M are illustrations of data about the results of an embodiment.

The applicant analyzed the result of the process 900 on a substrate with a variety of features. The analyzed features included periodically alternating lines and spaces with some duty cycle or with some space width to line width ratio. The following is an example of space-line features with ~106-107 nm etch depth and with the following space_line (μm) features: 0.18_0.18; 0.25_0.25: 0.5_0.5; 1_1; 3_1; 5_1; 100_1; 2_2; 10_90; 50_50; and 90_10. FIG. 10A illustrates the measured step sizes of these different space line combinations, before planarization, after an intermediary stage, and after an additional stage. After the intermediary stage the measured step sizes were 6.38 nm-8.75 nm. After the additional stage the measured step sizes were 4.14 nm-5.68 nm.

Figure 10B:
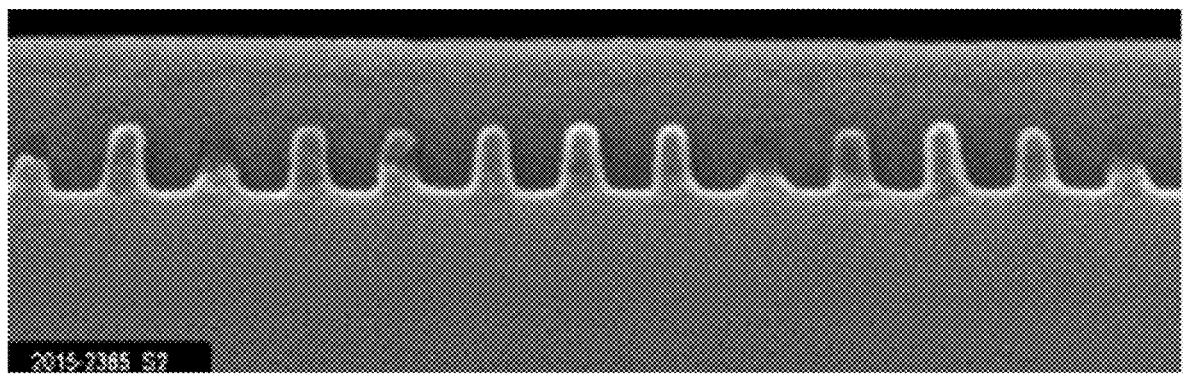
Figure 10C:
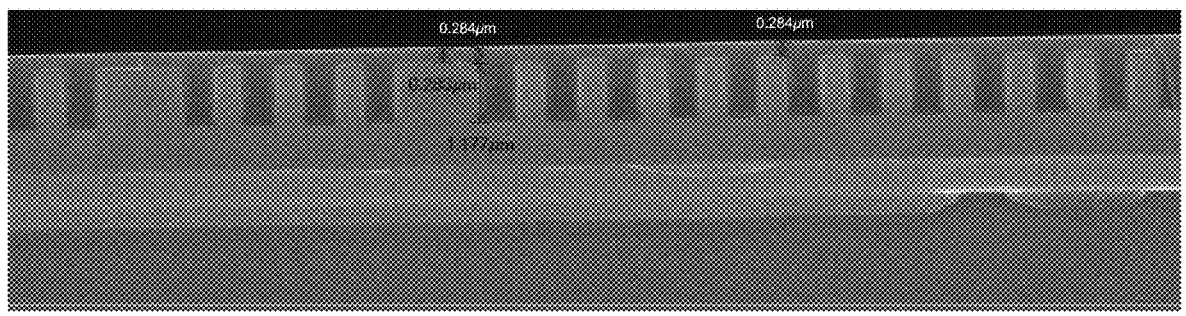
Figure 10D:
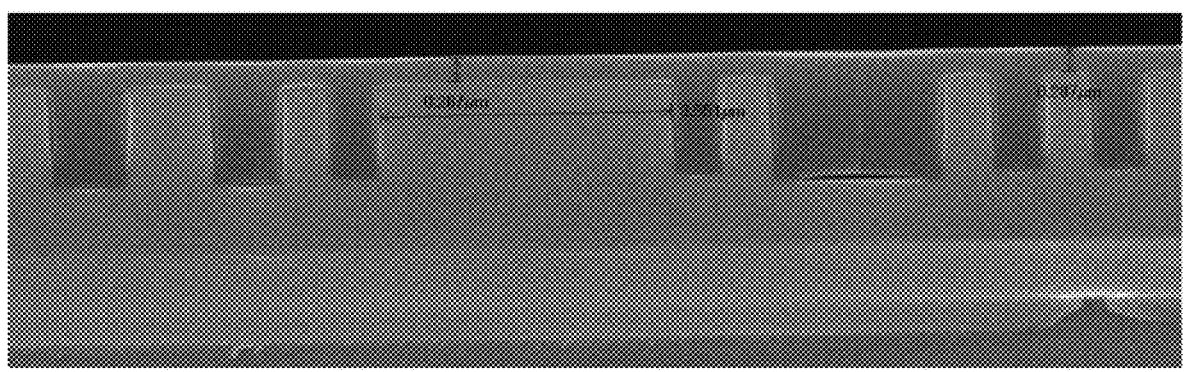
Figure 10E:
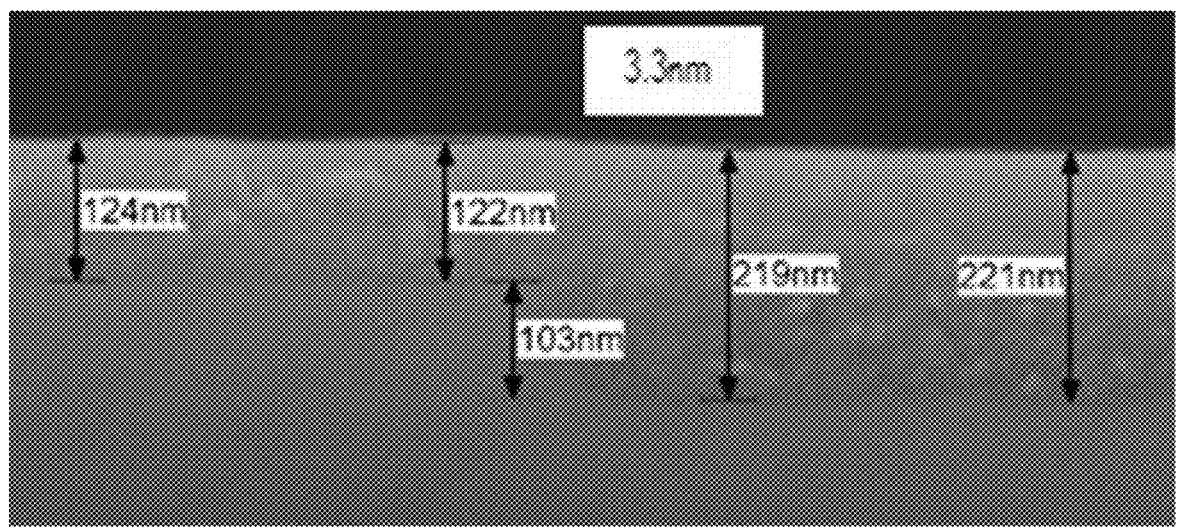

FIG. 10B is a SEM micrograph of a single planarization of 30 nm lines. FIG. 10C is a SEM micrograph of a single planarization of 750 nm lines. FIG. 10D is a SEM micrograph of a single planarization of a combination of dense and semi-dense lines. FIG. 10E is a SEM micrograph of a topography step of 107 nm height between full height line and trench in 50 (μm_ 50 (μm) space-line pattern after the intermediary stage and the additional stage.

This process may be applied to any underlying film stack that forms unwanted topography. This film stack can be formed on any type of substrate including silicon, silicon oxide ($SiO_2$), etc. One example of the film stack is a stack with the spin-on-carbon (SOC) top layer. SOC is used in industry to partially planarize unwanted topography of underlying pattern before any lithography step. As the SOC planarization technique is not ideal, the planarizing technique described above may be used thereafter to reach the required level of planarization. A SOC layer may also be deposited on top of the planarization process described above. In an alternative embodiment, in between steps 910 and 912 a superstrate is brought into contact with the second material. The following describes the process 900 on top of spin-on-carbon (SOC) layer.

Figure 10F:
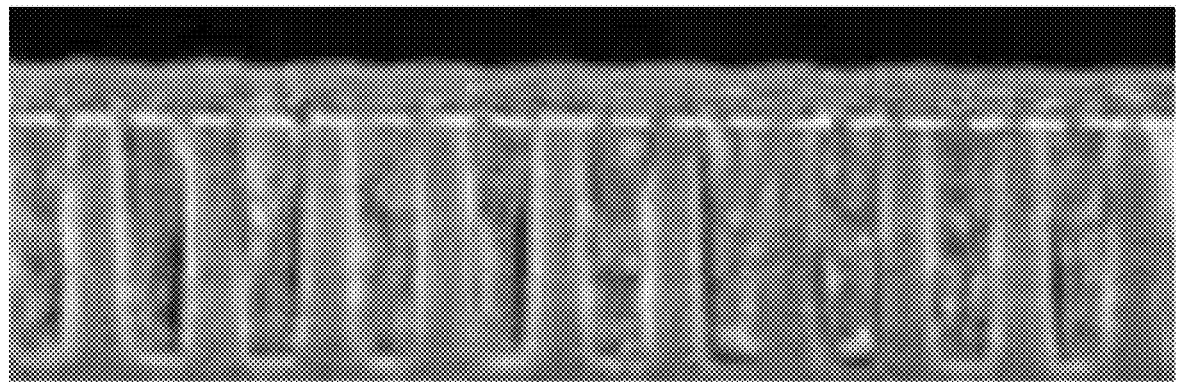
Figure 10G:
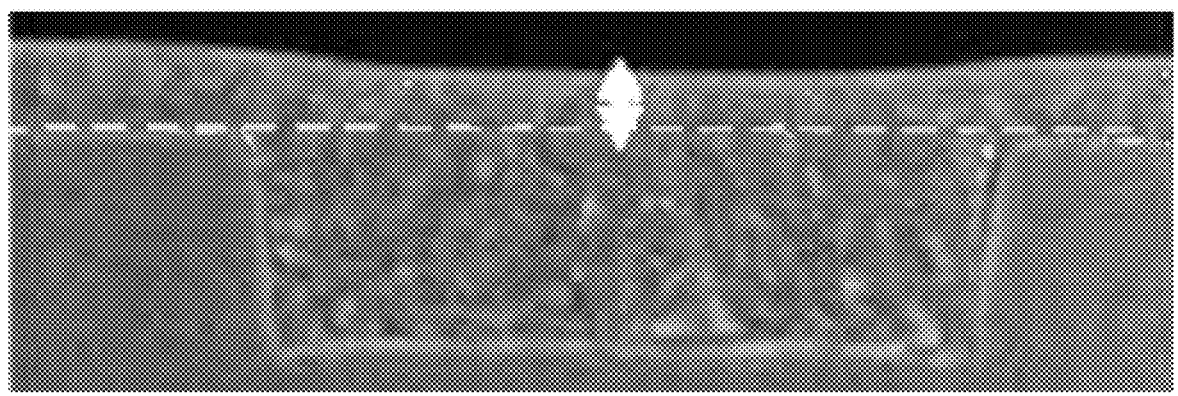

FIG. 10F shows a SEM micrograph of a single planarization layer using spin on carbon (SOC) over a dense pattern. FIG. 10G shows a SEM micrograph of that same single planarization layer using SOC over an isolated trench. A "dish" profile is formed above that trench. Note that in the dense pattern, FIG. 10F, AR is higher than in the isolated trench, FIG. 10G, the planarization layer maintains planarization while over the isolated trench the planarization layer dips.

Figure 10H:
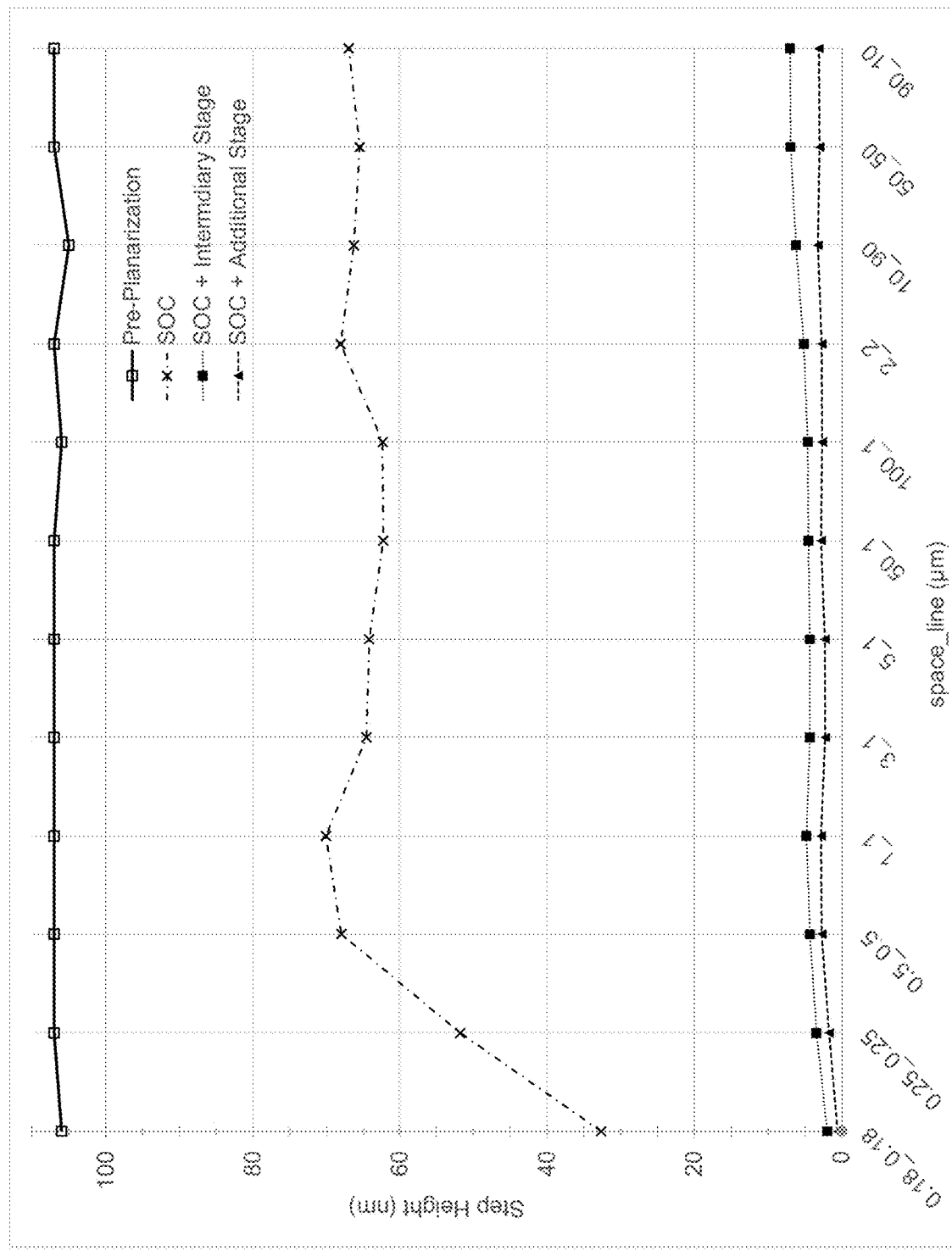

FIG. 10H illustrates the measured step sizes of these different space line combinations before any planarization, after a SOC planarization, after a first superstrate planarization done on top of the SOC planarization, and after the process 900 on top of the first substrate planarization. After the SOC planarization the measured step sizes were 32.7 nm-70.1 nm. SOC shows better planarization over features smaller than 0.25 micron with 1:1 duty cycle of line-space pattern. After the intermediary stage is done on top of the SOC planarization the measured step sizes were 1.95 nm-7 nm. After the additional stage step sizes were 0.516 nm-3.15 nm. This range of topography variations is an improvement compare to planarization of non-SOC coated substrate film stack.

Figure 10I:
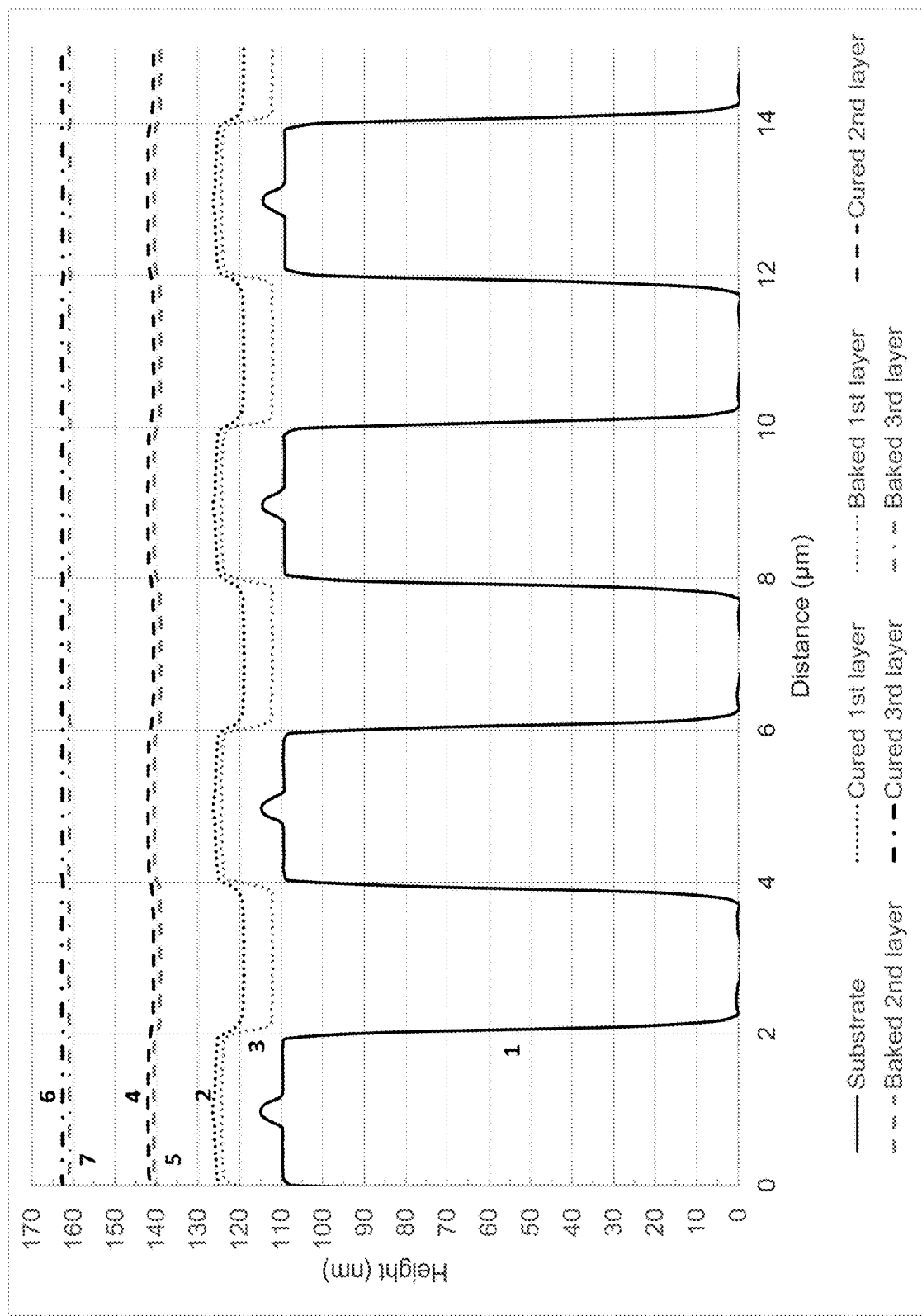

FIG. 10I is an illustration of the topography after various steps in a double planarization process that includes baking. The solid black curve in FIG. 10I shows AFM cross-sectional view of a substrate with a 2 μm line space grating formed on it. The black doted curve in FIG. 10I shows a cured first material profile with the height variations are 7.5 nm. The grey dotted curve in FIG. 10I shows a cured first material profile after baking at 200° C. for 60 seconds (s). Due to thermal shrinkage the surface profile height variations increases to ~12 nm.

The black dashed curve in FIG. 10I shows a second cured layer on top of the baked layer. As one can see the surface height variations decreases to ~1.3 nm and may be caused by UV shrinkage. The grey dashed curve 5 shows the surface profile after second layer is also baked at 200° C. for 60 s which increases the height variations to ~1.6 nm.

The cycle of coating, curing, and baking may be repeated if further planarization is required. The black dot-dash curve of FIG. 10I shows a third coating being applied and cured with an average film thickness of 24 nm. The total surface height variations are approximately 0.4 nm. The grey dot-dash curve of FIG. 10I shows surface profile after a third baking at 200° C. for 60 s. The total surface height variations for are approximately 0.5 nm.

An advantage of using baking after each planarization is that the resist thickness is thermally set and does not change after another cycle of heating. This minimizes the contribution of thermal shrinkage in a process which requires subsequent heating of the planarization film.

Figure 10J:
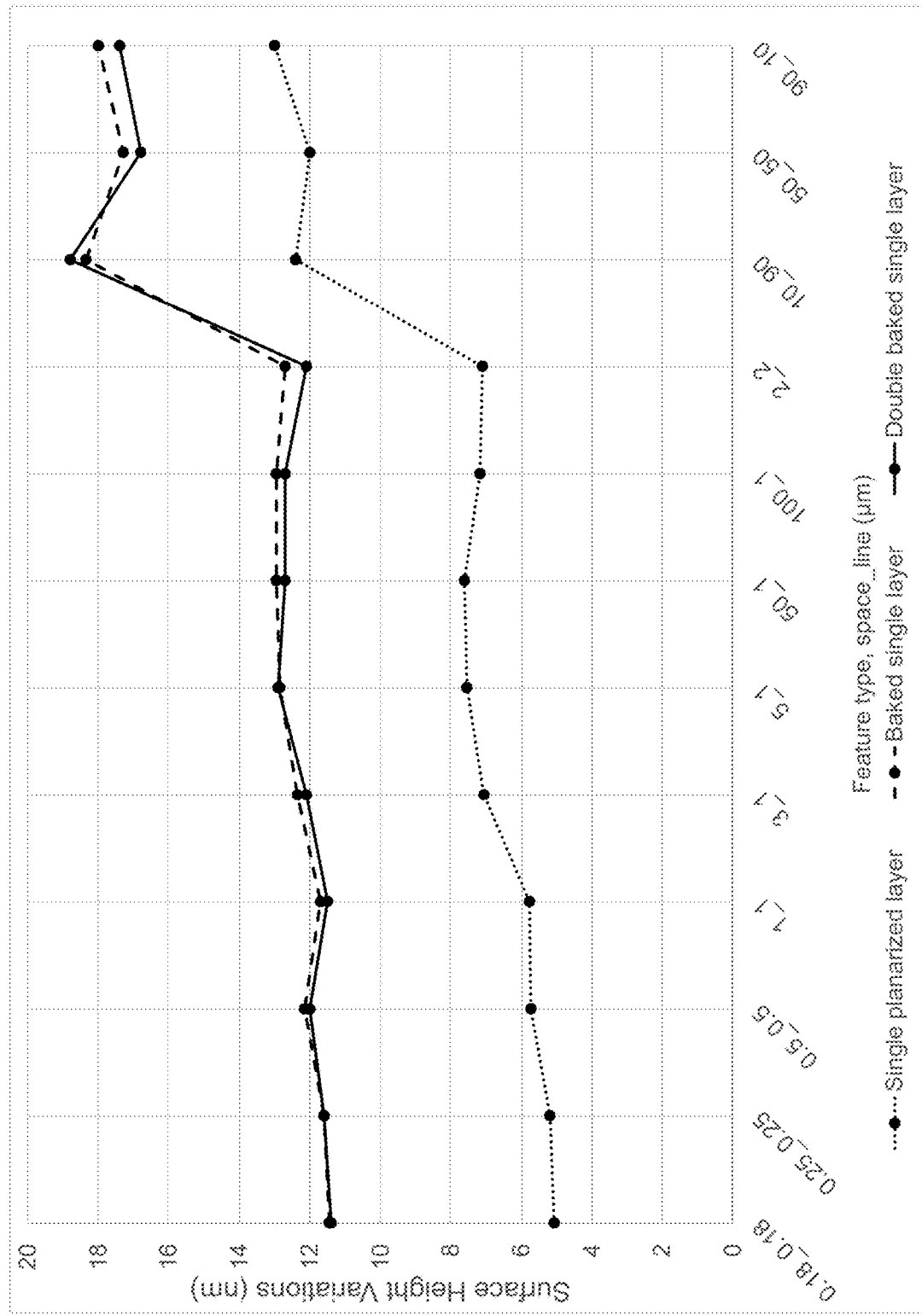

FIG. 10J is an illustration of the results for various planarization processes for test patterns that contain the following set of features: 0.18/0.18 μm; 0.25/0.25 μm; 0.5/0.5 μm; 1/1 μm; 2/2 μm; 50/50/μm space/line gratings with 50% duty cycle and 3/1 μm, 5/1 μm, 50/1 μm, 10/90 μm and 90/10 μm space/line gratings with various duty cycles. The dotted curve in FIG. 10J is an illustration of the maximum height variations across various features that were observed, ~13 nm surface height variation are observed for the larger gratings.

Examples of follow on process that might be used after a planarization process are: silicon oxide deposition process at 200° C.; spin-on application of SOG (spin-on-glass) material followed by baking at 250° C. and/or other processes which may require temperatures as high as 400° C.

The dashed line in FIG. 10J shows surface height variations after a patterned substrate has been planarized with a single layer and then baked at 200° C. for 60 s. The applicant has found that the planarization layer shrinks non-uniformly across the pattern. The planarization layer shrinks proportionally to the resist film thickness. The applicant has found that large open spaces in the pattern shrink more than the areas above narrow lines as the portion of the film that shrinks is thinner. The solid line in FIG. 10J is an illustration of a single planarization layer that was baked twice at 200° C. for 60 s.

Figure 10K:
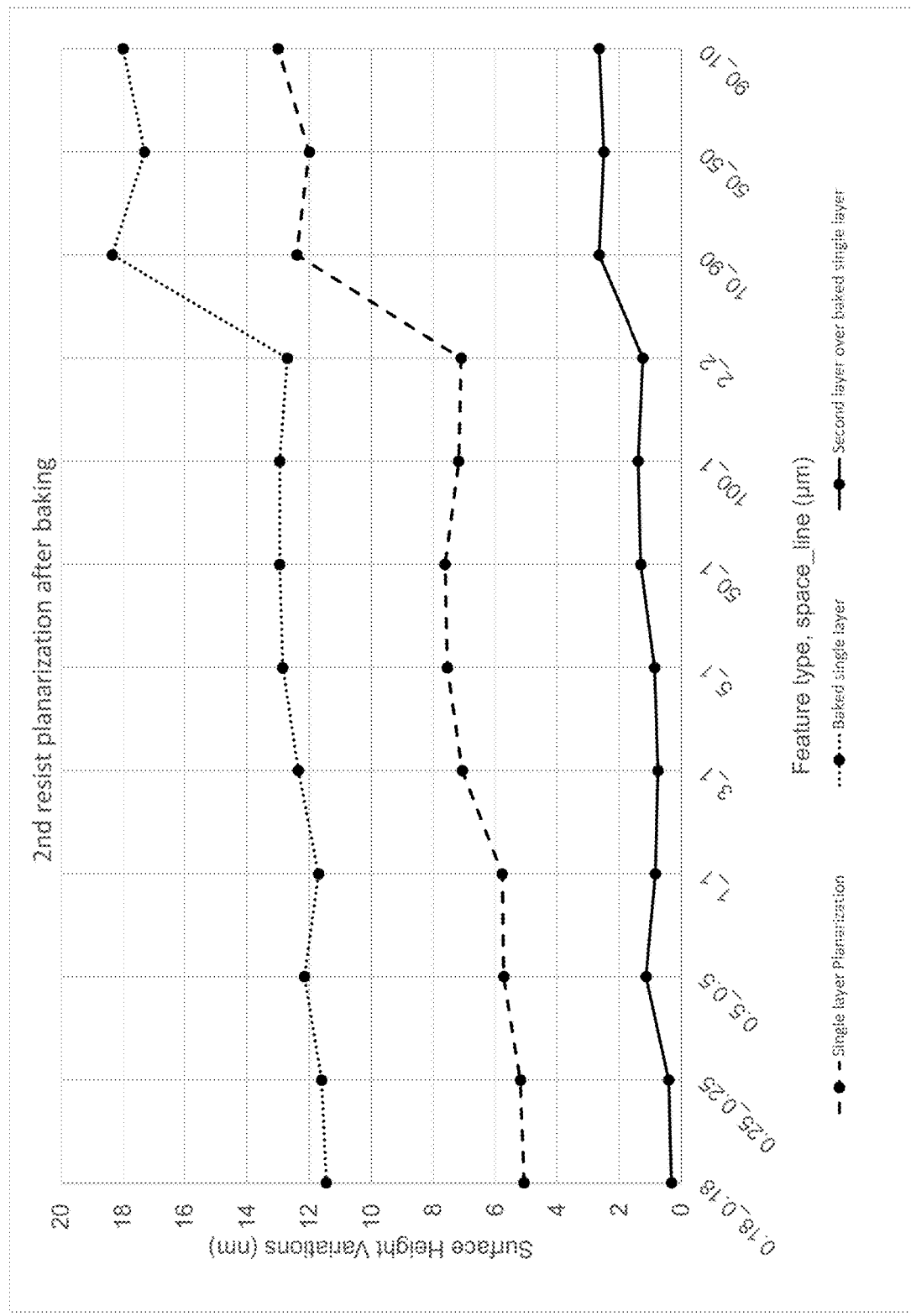

The applicant has found that shrinkage may be addressed, with multiple planarization (at least two) steps with a baking step in between planarization steps. In which each of the planarization steps makes use of a superstrate that is brought into a contact with a planarization material that is solidified while the superstrate is in contact with the planarization material. FIG. 10K shows surface height variations in various stages of the planarization process. The dashed line in FIG. 10K shows the surface height variations after a single planarization process. The dotted line in FIG. 10K shows how the surface height variations increase after the single planarization layer is baked at 200° C. for 60 s. The solid black line shows how the surface height variations can be reduced significantly after a second planarization step is performed after the baking step.

Figure 10L:
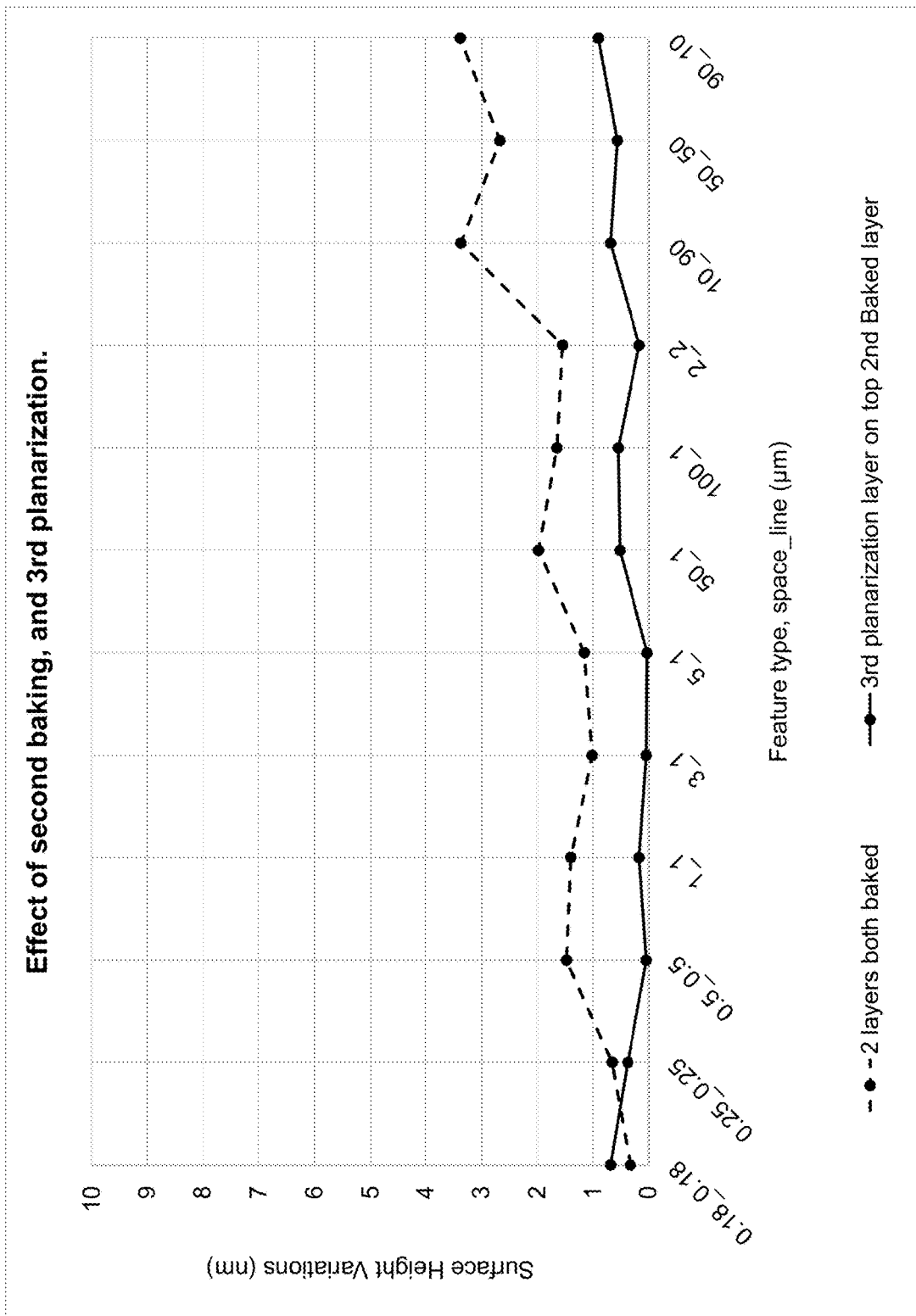

FIG. 10L is an illustration of surface height variations after baking and a third planarization step. The dashed line in FIG. 10L describes height variations after a second baking step is performed after the second planarization step. While the surface height variation does increase it is still a significant improvement over a single planarization process. The solid line in FIG. 10L shows the surface height variations of a third planarization layer that is applied after the second layer is baked which has very low surface height variations across all feature types.

In an embodiment, the baking temperature may be set to be higher than the temperature that will be performed in subsequent processing steps. For instance, if the subsequent processing steps uses a 250° C. process, the intermediate baking step may performed at 350° C. The applicant has found that the intermediate baking temperature should be equal to or higher than the subsequent processing temperature, which will produce a flat and thermally stable substrate.

Figure 10M:
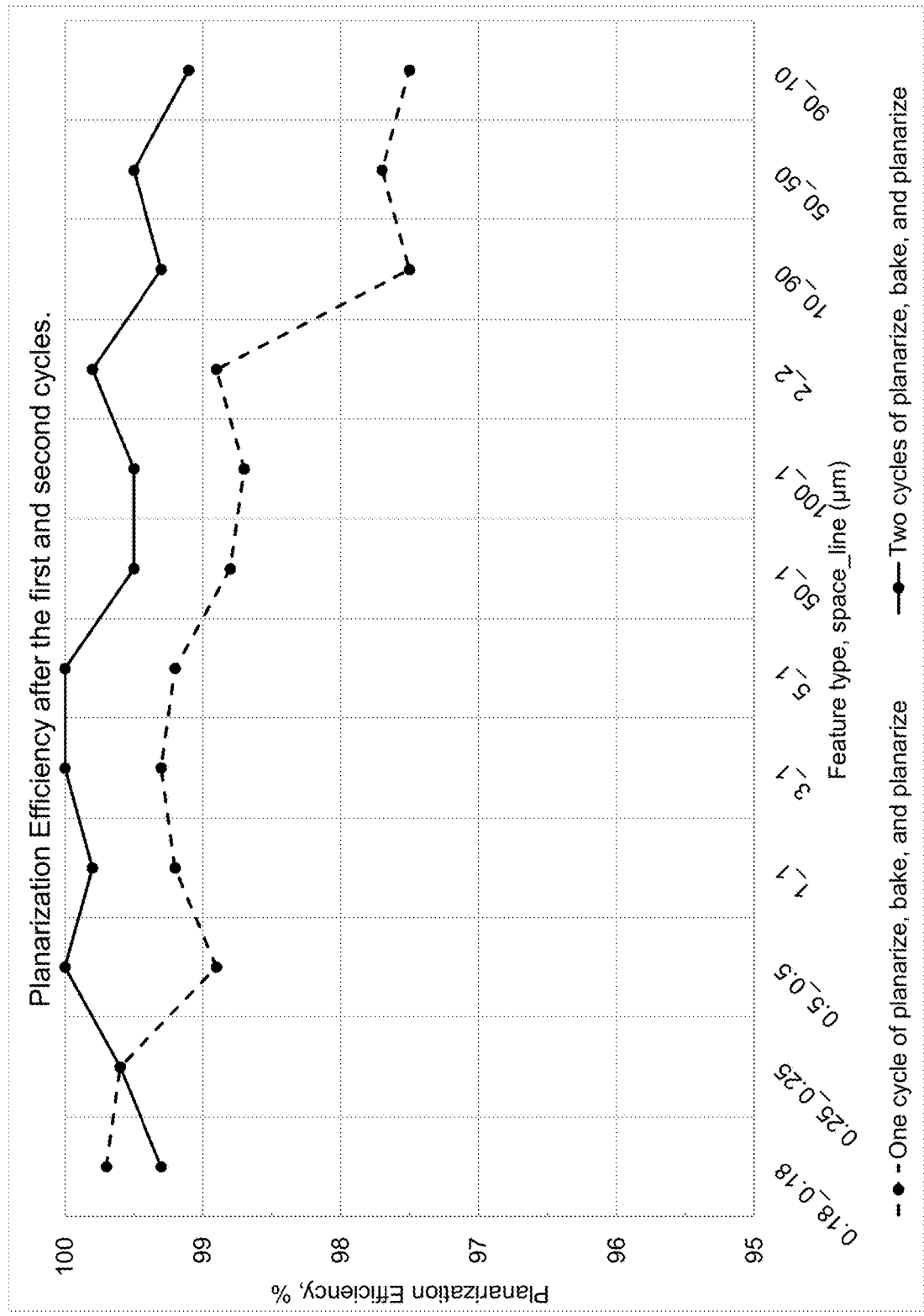

FIG. 10M is an illustration of the planarization efficiency (PE) after the first and second planarization cycles. After the first planarization cycle that includes: planarizing, baking, and second planarizing we get PE higher than 97% across large feature size variations as shown by the dotted line in FIG. 10M. A second treatment cycle of a second baking and a third planarization step shows PE higher than 99% across large feature size variations as shown by the solid line in FIG. 10M.

The imprint type planarization tool can be used to fabricate devices on a substrate such as: CMOS logic; microprocessors; NAND Flash memory; NOR Flash memory; DRAM memory; MRAM; 3D cross-point memory; Re-RAM; Fe-RAM; STT-RAM; optoelectronics and other devices in which planarization is used as part of the fabrication process.

Other substrates materials can include but is not limited to: glass; fused silica; GaAs; GaN; InP; Sapphire, AITiC; and other substrates well known in the art. Devices, fabricated on these substrates include patterned media, field effect transistor devices, heterostructure field effect transistors, light emitting diodes, read/write heads; and the like.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A planarization method of a substrate, wherein a substrate surface of the substrate has a substrate topography variation, wherein the substrate topography variation includes a plurality of steps and a plurality of trenches, wherein a substrate step among the plurality of steps has a substrate step height, the substrate surface includes a substrate trench among the plurality of trenches that is adjacent to the substrate step, wherein the substrate trench has a trench width, the method comprising the steps of:
    dispensing a first material onto the surface of the substrate, wherein a volume of the first material varies across the substrate surface depending upon the substrate topography variation;
    bringing a superstrate into contact with the first material such that the first material takes on a shape of the superstrate;
    solidifying the first material, wherein a first material property of the first material is a first shrinkage coefficient;
    lifting the superstrate away from the solidified first material;
    dispensing a second material onto the solidified first material, wherein the second material is dispensed onto the solidified first material with an average thickness, wherein the average thickness is greater than a second material thickness threshold that is dependent upon the substrate step height and the first shrinkage coefficient, wherein the second material thickness threshold is dependent upon the Poisson's ratio of the first material; and
    solidifying the second material.

2. The planarization method according to claim 1, wherein the substrate step marks a boundary between a first region and a second region, and wherein a thickness of the second material is dependent upon a variation in the shrinkage of the thickness of the first material across the surface of the substrate.

3. The planarization method according to claim 2, wherein
    the shrinkage in the thickness of the first material in the first region is proportional to a top layer thickness of the first material in the first region;
    the shrinkage of the first material in the second region is proportional to a thickness of the first material in the second region; and
    the variation in the shrinkage of the first material is equal to a difference between the shrinkage of the first material in the first region and the shrinkage of the first material in the second region.

4. The planarization method according to claim 1, wherein solidifying the first material includes exposing the first material to actinic radiation while the superstrate is in contact with the first material.

5. The planarization method according to claim 1, wherein the substrate step among the plurality of steps is that step in which a ratio of the trench width divided by the substrate step height is highest among the plurality of steps.

6. The planarization method according to claim 1, wherein:
    the solidified first material has a first material post-cure topography variation that is between 2-20 nm; and the solidified second material has a second material post-cure topography variation that is between 0-6 nm.

7. The planarization method according to claim 1, wherein:
the solidified first material has a first material post-cure topography variation; and
the solidified second material has a second material post-cure topography that is less than half of the first material post-cure topography variation.

8. The planarization method according to claim 1, further comprising:
baking the solidified first material prior to dispensing a second material onto the solidified first material.

9. The planarization method according to claim 1, further comprising:
bringing the superstrate into contact with the second material such that the second material takes on the shape of the superstrate.

10. A planarization method of a substrate, wherein a substrate surface of the substrate has a substrate topography variation, wherein the substrate topography variation includes a plurality of steps and a plurality of trenches, wherein a substrate step among the plurality of steps has a substrate step height, the substrate surface includes a substrate trench among the plurality of trenches that is adjacent to the substrate step, wherein the substrate trench has a trench width, the method comprising the steps of:
dispensing a first material onto the surface of the substrate, wherein a volume of the first material varies across the substrate surface depending upon the substrate topography variation;
bringing a superstrate into contact with the first material such that the first material takes on a shape of the superstrate;
solidifying the first material, wherein a first material property of the first material is a first shrinkage coefficient;
lifting the superstrate away from the solidified first material;
dispensing a second material onto the solidified first material; and
solidifying the second material;
wherein prior to solidifying the first material has a pre-cure topography,
wherein above the substrate trench the pre-cure topography has an additional thickness $h_a$ that is substantially in accordance with equation (a):

$$h_a = h_f \frac{k_s}{1 - k_s} \quad (a)$$

in which the substrate step height is $h_f$ and the first shrinkage coefficient is $k_s$.

11. The planarization method according to claim 10, wherein:
one or both of the volume of the first material in the substrate trench and the shape of the superstrate are configured such that the additional thickness $h_a$ is substantially in accordance with equation (a) in a first set of trenches among the plurality of trenches in which a ratio of the trench width with the substrate step height is greater than a first ratio; and
there is no additional thickness $h_a$ in those trenches among the plurality of trenches not among the first set of trenches.

12. The planarization method according to claim 11, wherein the first ratio is 2.

13. A method of manufacturing an article on a substrate, wherein a substrate surface of the substrate has a substrate topography variation, wherein the substrate topography variation includes a plurality of steps and a plurality of trenches, wherein a substrate step among the plurality of steps has a substrate step height, the substrate surface includes a substrate trench among the plurality of trenches that is adjacent to the substrate step, wherein the substrate trench has a trench width, the method comprising the steps of:
dispensing a first material onto the surface of the substrate, wherein a volume of the first material varies across the substrate surface depending upon the substrate topography variation;
bringing a superstrate into contact with the first material such that the first material takes on a shape of the superstrate;
solidifying the first material, wherein a first material property of the first material is a first shrinkage coefficient;
lifting the superstrate away from the solidified first material;
dispensing a second material onto the solidified first material; and
solidifying the second material, wherein the second material is dispensed onto the solidified first material with an average thickness, wherein the average thickness is greater than a second material thickness threshold that is dependent upon the substrate step height and the first shrinkage coefficient, wherein the second material thickness threshold is dependent upon the Poisson's ratio of the first material.

14. A method of manufacturing an article on a substrate, wherein a substrate surface of the substrate has a substrate topography variation, wherein the substrate topography variation includes a plurality of steps and a plurality of trenches, wherein a substrate step among the plurality of steps has a substrate step height, the substrate surface includes a substrate trench among the plurality of trenches that is adjacent to the substrate step, wherein the substrate trench has a trench width, the method comprising the steps of:
dispensing a first material onto the surface of the substrate, wherein a volume of the first material varies across the substrate surface depending upon the substrate topography variation;
bringing a superstrate into contact with the first material such that the first material takes on a shape of the superstrate;
solidifying the first material, wherein a first material property of the first material is a first shrinkage coefficient;
lifting the superstrate away from the solidified first material;
dispensing a second material onto the solidified first material; and
solidifying the second material;
wherein prior to solidifying the first material has a pre-cure topography,
wherein above the substrate trench the pre-cure topography has an additional thickness $h_a$ that is substantially in accordance with equation (a):

$$h_a = h_f \frac{k_s}{1-k_s} \qquad (a)$$

in which the substrate step height is $h_f$ and the first shrinkage coefficient is $k_s$.

* * * * *